United States Patent
Gollomp et al.

(10) Patent No.: US 6,424,157 B1
(45) Date of Patent: Jul. 23, 2002

(54) SYSTEM AND METHOD FOR MONITORING A VEHICLE BATTERY

(75) Inventors: Bernard P. Gollomp, Palisades, NY (US); Thirumalai G. Palanisamy, Morris Township, Morris County; Douglas Vernick, Millburn, both of NJ (US)

(73) Assignee: AlliedSignal, Inc., Morristown, NJ (US)

( * ) Notice: Subject to any disclaimer, the term of this patent is extended or adjusted under 35 U.S.C. 154(b) by 0 days.

(21) Appl. No.: 09/357,542

(22) Filed: Jul. 20, 1999

Related U.S. Application Data
(60) Provisional application No. 60/093,425, filed on Jul. 20, 1998.

(51) Int. Cl.[7] .......................... G01N 27/27; G01R 31/36
(52) U.S. Cl. .................... 324/430; 324/425; 324/426; 324/433; 320/132
(58) Field of Search .................... 324/430, 425, 324/426, 427, 431, 433; 320/48, 132

(56) References Cited

U.S. PATENT DOCUMENTS

| | | | | |
|---|---|---|---|---|
| 4,937,528 A | * | 6/1990 | Palanisamy | 324/430 |
| 5,321,627 A | * | 6/1994 | Reher | 324/427 X |
| 5,381,096 A | * | 1/1995 | Hirzel | 324/427 |
| 5,404,106 A | * | 4/1995 | Matsuda | 324/431 |
| 5,635,842 A | * | 6/1997 | Yokoo et al. | 324/427 |
| 5,672,951 A | * | 9/1997 | Shiota | 324/430 X |
| 5,680,050 A | * | 10/1997 | Kawai et al. | 324/427 |
| 5,705,929 A | * | 1/1998 | Caravello et al. | 324/430 |
| 5,721,688 A | | 2/1998 | Bramwell | 364/483 |
| 5,744,962 A | * | 4/1998 | Alber et al. | 324/426 |
| 5,751,217 A | * | 5/1998 | Kchao et al. | 324/430 X |
| 5,761,072 A | * | 6/1998 | Bardsley, Jr. et al. | 324/427 X |
| 5,828,218 A | * | 10/1998 | Yokoo et al. | 324/427 |
| 5,900,734 A | * | 5/1999 | Munson | 324/433 |
| 6,091,228 A | * | 7/2000 | Chady et al. | 324/430 X |
| 6,097,193 A | * | 8/2000 | Bramwell | 324/429 |

* cited by examiner

*Primary Examiner*—N. Le
*Assistant Examiner*—T. R. Sundaram
(74) *Attorney, Agent, or Firm*—Loria B. Yeadon

(57) ABSTRACT

A system and method for monitoring and reporting on the condition of a vehicle battery which measures battery voltage and current drain during engine start, and computes the battery dynamic internal resistance (IR) and dynamic polarization resistance (PR) from these quantities. Also, the quiescent voltage (QV) of the battery, which is that measured while the vehicle electrical system has a current drain of from 0 to a predetermined amount, is measured and the battery state-of-charge (SoC) is computed from the QV. From these quantities, calculations are made of quantities such as rate of change of dynamic IR and PR to analyze battery condition, rate of change of QV and SoC to predict the time during which the battery can still start the engine, and minimum ambient temperature at which the battery will be able to start the engine, and of other conditions. Appropriate messages can be displayed of the measured and computed quantities as well as warnings to advise the driver of various real and potential problems related to the battery, its cables and components of its charging system.

32 Claims, 10 Drawing Sheets

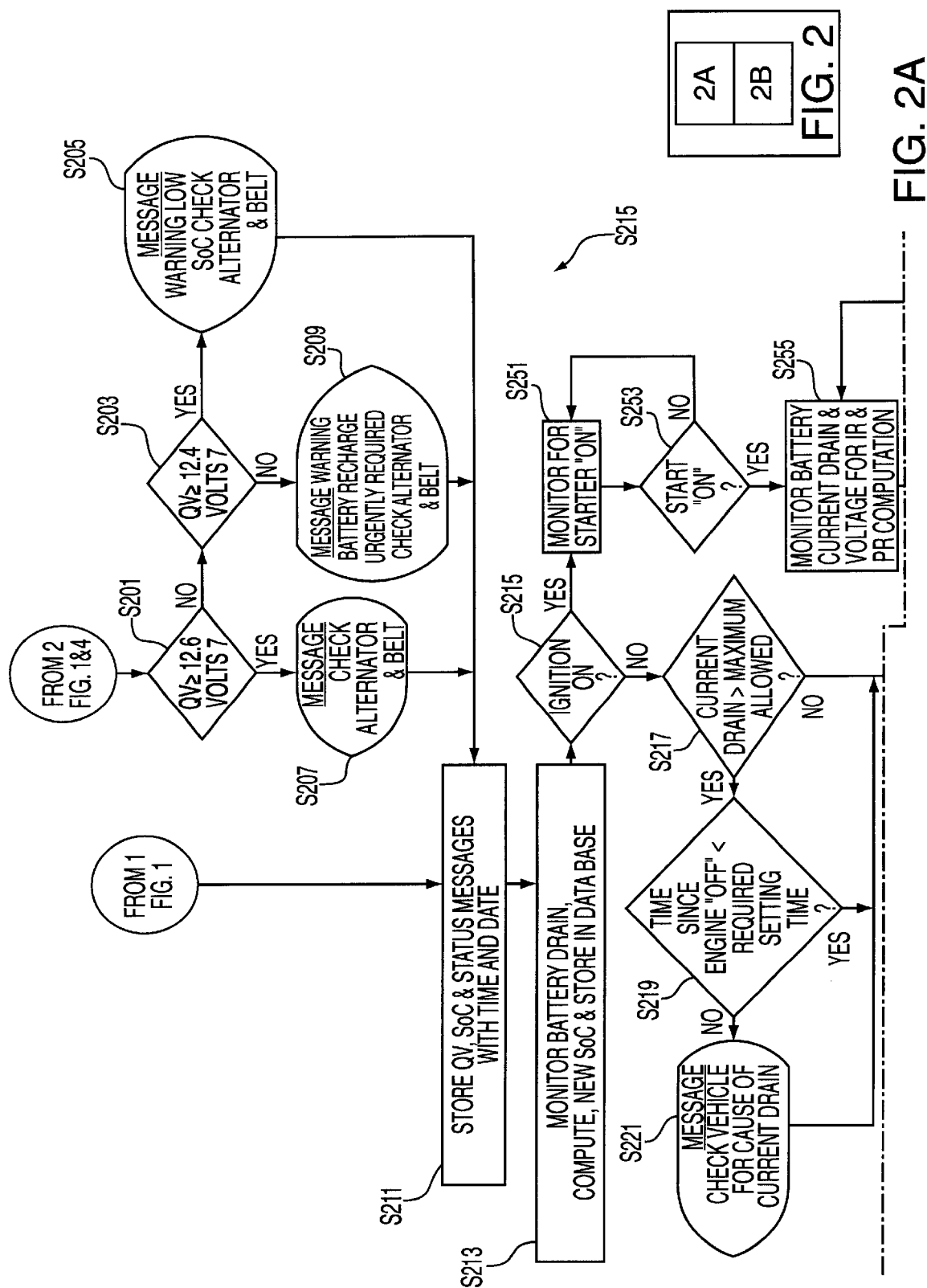

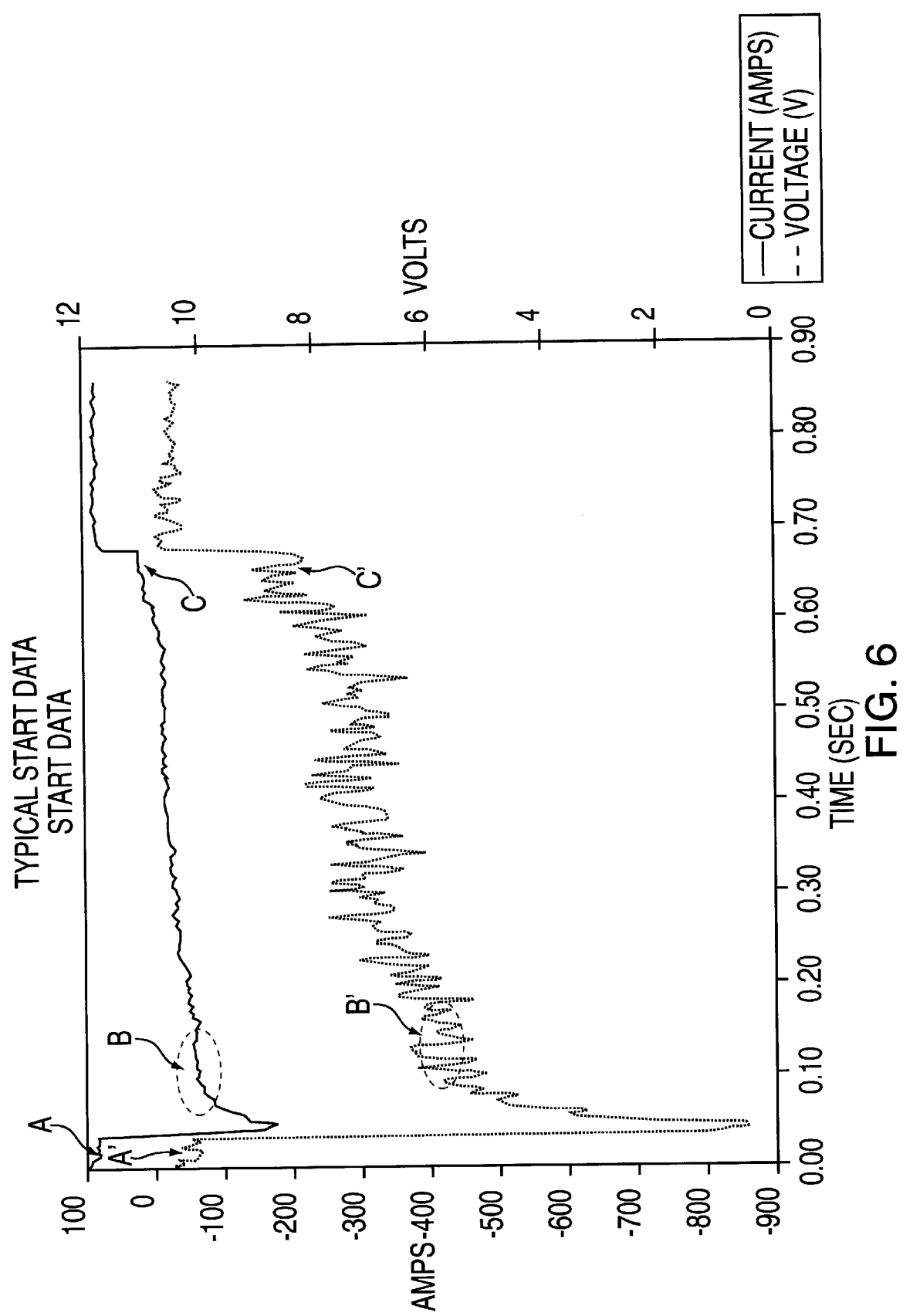

SYSTEM AND METHOD FOR MONITORING A VEHICLE BATTERY

This application claim benefit of Provisional application 60/093,425 filed Jul. 20, 1998.

FIELD OF THE INVENTION

This invention relates to a system and method that non-intrusively monitor and report on the condition and performance of electrochemical batteries used in vehicles.

BACKGROUND OF THE INVENTION

The primary purpose of batteries used in internal combustion powered vehicles is to provide energy for starting, lighting and ignition (SLI), and accordingly, they are referred to as SLI batteries. The secondary purpose of such batteries is to provide energy during periods when a vehicle's electrical energy generation (alternator and its regulator) system cannot temporarily sustain the electrical load. Batteries invariably do not lose the ability to perform their functions or fail instantaneously. Loss of capability or the inability of a battery to provide electrical energy results from various degrading factors, several of which are described below.

Batteries, regardless of type (e.g., thin plate SLI (Starting-Lighting-Ignition) or thick plate (Storage or Traction), or electro-chemistry system, e.g., Lead-Acid, Nickel-Cadmium NiCd, Nickel Metal Hydride, Lithium-Ion, etc., share the common characteristics of loss of capability to perform their normal functions. No single measured parameter is available to indicate battery performance capability.

Battery performance capabilities continuously vary. Temperature, electrolyte and plate condition and SoC (State-of-Charge) are among the primary influencing factors. Battery internal resistance (IR), polarization resistance (PR) and SoC, have been used as sources of information for providing real-time reporting of battery conditions and performance capabilities. For example, it is known that the maximum instantaneous power that a battery can output is inversely proportional to its internal resistance. Battery polarization resistance PR, which arises from non-uniformity in electrolyte concentration at the battery plates, affects the power output in a somewhat similar manner. Two systems for indicating certain aspects of battery capability and a few possible fault conditions are described in U.S. Pat. No. 4,937,528, entitled "Method For Monitoring Aircraft Battery Status" and U.S. Pat. No. 5,281,919, entitled "Automotive Battery Status Monitor".

A battery having assured performance capability requires a high SoC and high capacity, usually measured in Amp/hours, plus low dynamic internal resistance (IR). As used herein, the term "dynamic IR" means the battery IR (internal resistance) measured when an installed battery discharges current to a large load, such as a starter motor during engine cranking.

Terminal voltage or electrolyte gravimetric measurements have been used to indicate state-of-charge (SoC). Battery capacity measurement typically involves employing a shop or laboratory tester and use of procedures that require measurement of total discharge followed by the measurement of total re-charge.

Static IR is generally used to verify design and quality consistency and assurance. Methods for static IR measurement require charging a battery to the maximum state-of-charge (SoC) as determined when the maximum terminal voltage is achieved. Following charging to maximum SoC, a battery is subjected to a series of increasing loads for specific time periods. During these programmed discharges, current and voltage are monitored and internal resistance values are computed and plotted. The plotted data indicates the static IR. Such tests may also be performed at various temperatures and various levels of SoC. Dynamic IR also indicates quality but, more important, it has been found to be a predictor of the battery's ability to meet a vehicle's demand under high load conditions, such as engine starting, over the expected range of temperature at which the battery is to operate.

Battery capacity and IR (both static and dynamic) undergo changes. No two batteries may necessarily have identical values. Battery plate conditions, including both the plate surface and the usefulness of the active plate material, constantly change. An electrochemical system loses capacity when effective plate area is reduced by such conditions as sulfation for a lead-acid battery or memory effect for a NiCd battery. These effects are well known.

All re-chargeable batteries can sustain many discharge-recharge cycles. The number of cycles is influenced by the rate at which the plates deteriorate. The reasons for and duration of the deterioration are influenced by such use conditions as ambient temperatures, magnitude and duration of the load, low SoC durations, vibration and other cyclical effects. Catastrophic conditions occasionally occur. For example, short circuits cause extremely large discharges which produce rapid and large rises in plate temperatures that cause plate warping along with active material loss.

SLI batteries have thin and very porous plates. Batteries designed for continuous duty for periods between re-charging have thick plates. The thin plates in SLI batteries provide large current out-rushes at the beginning of vehicle engine cranking. At low temperature conditions, a typical 5-liter engine frequently draws 1600 or more Amperes during engine cranking. This large battery current out-rush or drain during cranking, lasts for around 10 milliseconds or less depending on many factors. The large current drain continues at a declining rate during cranking. This is shown in FIG. 6 (described in detail below), which depicts voltage (across the battery terminals) and current waveform curves during engine cranking. Engine cranking is usually limited to 2 engine revolutions for modern, sequential fuel injected engines. Reasons for limiting engine revolutions include avoiding the production of unnecessary hydrocarbon emissions, damaging the vehicle's catalytic converter, starter motor over-heating and the possibility for battery plate-warping.

The voltage and current curves, depicted in FIG. 6, provide the dynamic bases for determining battery dynamic internal resistance (IR) and polarization (PR). The IR and PR of batteries for electric and hybrid vehicles are determined in a like manner.

The SoC of a battery is generally defined as the percentage of battery charge capacity available relative to the rated battery capacity at that time. In an SLI (lead-acid) battery, as the SoC increases from 80% to 95%, the conversion efficiency of the battery from electrical (charge input) to chemical conversion by the battery declines from 99% to 95% or less. Above 92% SoC, SLI batteries are more prone to generating Hydrogen—electrolysis. This phenomenon causes electrolyte depletion and a potentially hazardous condition. To minimize these possible conditions, voltage regulators in internal combustion engine powered vehicles generally limit the charge of an SLI battery SoC to approximately 92%. The voltage regulators limit SoC by controlling the alternator output voltage. Since SoC is influenced by ambient temperature, voltage regulators employ temperature-varying resistors. This technique enables adjustment of the alternator output voltage used to charge the battery to accommodate .for high electrolyte activity in high ambient temperature environments and for a low activity level during low ambient temperatures.

Usually an alternator provides all of the vehicle's electric energy requirements during normal operation. However, high and low ambient temperatures frequently cause loads that exceed an alternator's capacity. Also, demands on alternators may exceed their capabilities with the ever increasing complement of OEM (Original Equipment Manufacturer) equipment in the vehicle and after-market devices, such as extra high intensity lighting, communications devices, computers and other electric energy consumers.

During periods of high ambient temperature and the consequential battery high electrolyte activity, corrosion of the battery plates becomes a possible cause for battery failure. The problem becomes more severe when operation is at night in a high temperature and high humidity environment for short periods that do not allow for the restoration of the battery charge by the alternator. Extremely cold ambient conditions at night, where electrolyte activity is low and opportunities to recharge may be fewer, are also causes for battery failure.

Charging system (alternator and regulator) failures or even partial reduction of their output capabilities often cause battery deterioration and at times unanticipated loss of operation. Present methods and apparatus directed towards mitigating these problems are limited. No means are currently known to be available which indicate all of the limitations of battery capability, on-going deterioration or other problems as discussed above. Limited means employed in the past were generally costly and intrusive.

Accordingly, a need exists to provide a system and method to monitor, or diagnose, the conditions of a vehicle battery on a real-time, non-intrusive basis, to monitor the vehicle alternator and regulator, and to predict battery performance and life.

BRIEF DESCRIPTION OF THE INVENTION

The present invention relates to a system and method for use with a vehicle battery, and particularly one used for SLI purposes. This invention is also applicable to both battery powered and hybrid vehicles, i.e., those which employ both internal combustion engines and batteries. The system and method of the invention effect real-time determination and notification to the vehicle user of battery state-of-charge (SoC), engine start alert capability, battery reserve capacity (in time units) and other factors, such as electrolyte depletion, on-going connector loosening (loss of "gas-tight" integrity) which in turn leads to corrosion, charging system (alternator and regulator) deterioration and failure, and electric energy deficits.

To assure performance veracity, the system and method employ re-calibration and updating techniques on a database of measured quantities. From this data, calculation of dynamic IR and dynamic PR is made, as well as an evaluation of the trends of increase or decrease of these factors and of battery SoC and capacity.

The present invention is a system and process implemented with a computer or similar equipment complemented with attached voltage, temperature and current sensing means that:

(a) continuously monitor ambient temperature, battery terminal voltage and current flow (i.e., charge and discharge) into and out of a battery in a vehicle, (b) dynamically determine internal resistance (IR) and polarization resistance (PR) during servicing of large energy demands such as engine starting, (c) construct databases stored in the computer memory, such as a partially permanent memory (e.g., electronically alterable read-only-memory EARPROM) for determining battery condition and capability, (d) accept and then store in the data base 1) vehicle data and battery data provided by the manufacturer, 2) vehicle electric load data, and 3) vehicle starting current data, such as included and used for SoC vs. IR, IR vs. Temperature, (e) acquire, accumulate and store vehicle and battery experience data, (f) adjust initially stored data using the experience data and store data revisions in the database, (g) compute condition trends for indicating current and future battery operation conditions, (h) use IR as corrected by battery temperature correction data with required IR vs. Temperature data to compute the lowest possible temperature at which the battery can start the engine (Limit), (i) continuously compute and update SoC as the result of recent and on-going discharge and charge experience as corrected by ambient conditions, (j) transmit advisories and condition reports to discrete or program displays and to other vehicle systems for electric load management, (k) report diminishing battery reserve capacity, in minutes or other appropriate time units, when a vehicle is idle (engine not running for internal combustion engine powered vehicles) or a charging system failure, such as a broken alternator belt, faulty regulator or defective alternator, (l) during engine non-operation (i.e., Sleep Mode), provide condition reserve capacity advisories that indicate the time remaining before a battery loses its capability for starting the engine. Advisories during engine operation, or "Run Mode", indicate the time remaining before a battery loses capability for supporting operation of the vehicle electrical system. This is useful because internal combustion engines depend on electric power for fuel pumping, ignition, fuel injection, control and so forth, and (m) when applicable, provide access to a database through a vehicle's diagnostic connector.

Although the invention is described relative to lead-acid battery technology which is usually employed in SLI and other vehicle batteries, the invention is applicable to other technologies, such as nickel metal hydride, and lithium ion. These batteries are further classified according to their construction: flooded cells, maintenance-free and sealed. This invention is applicable to any internal combustion engine powered vehicle with integral means for battery charge maintenance that transport or convey people, or material. Cars, trucks, boats, aircraft, agricultural and construction equipment and industrial prime movers (e.g., fork lifts, cranes) are examples. This invention is also applicable to hybrid vehicles, which employ both internal combustion engines and batteries for vehicle powering. Parts of this invention also are applicable to electric, battery-powered vehicles and hybrid vehicles.

OBJECTS OF THE INVENTION

It is an object of the invention to provide a method and system for continuously determining the condition of a vehicle battery and its capability.

Another object is to provide a method and system for continuously monitoring voltage and current responses of a vehicle battery to update a database that determines battery condition and capability, including its state-of-charge (SoC) and trends in conditions, such as depleting electrolyte, lose of capacity and other such pending failures.

A further object is to monitor, determine and indicate the condition of the associated alternator, regulator and drive components associated with a vehicle battery.

Yet another object is to provide a system and method for monitoring a vehicle battery and determining its reserve capacity relative to its ability to be able to start the vehicle engine.

An additional object is to provide a system and method that compute the lowest possible temperature at which a vehicle's battery is able to start the engine.

BRIEF DESCRIPTION OF THE DRAWINGS

Other objects and advantages will become more apparent upon reference to the following specification and annexed drawings in which:

FIG. 6 is a graph illustrating voltage and current conditions at the time of engine starting.

DETAILED DESCRIPTION OF THE INVENTION

Figure 7:
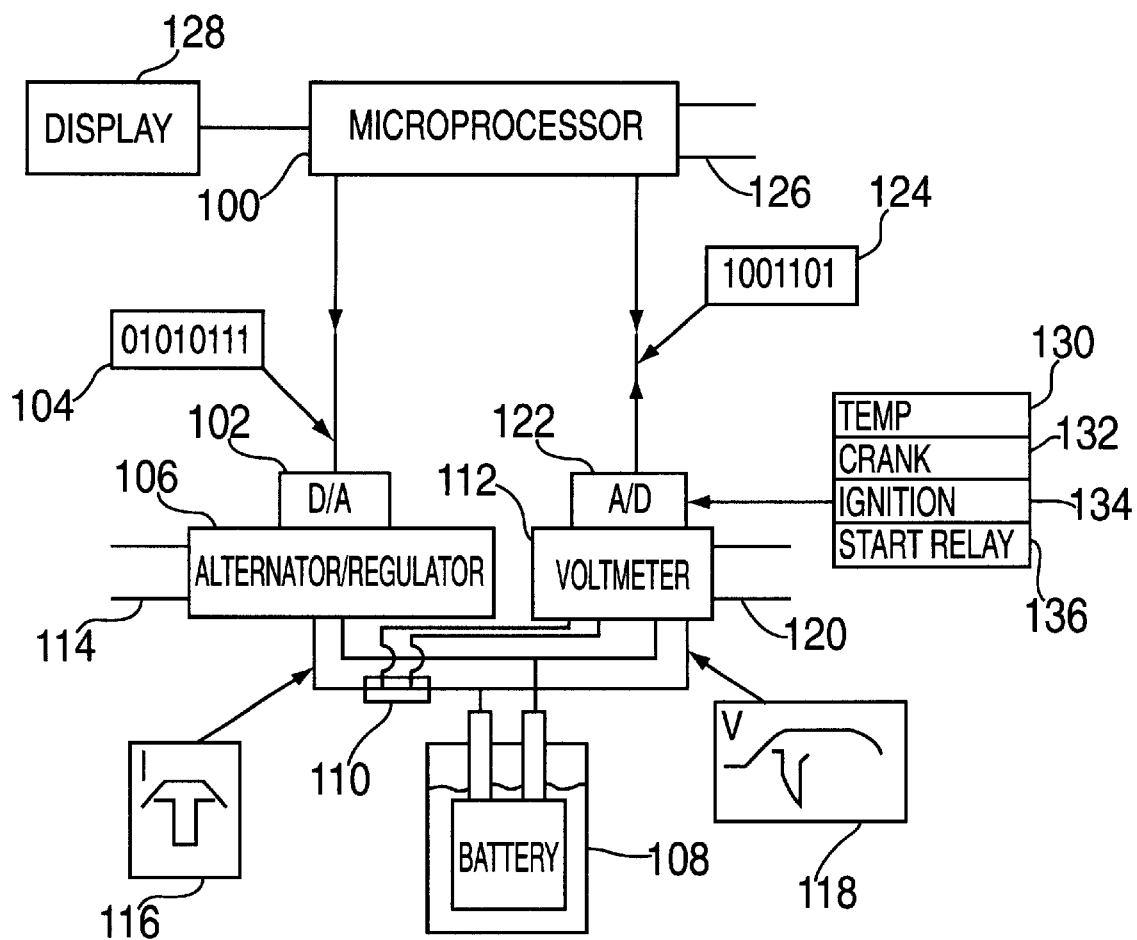
FIG. 7 block diagram of the battery monitor system of the invention in conjunction with some of the other components of the motor vehicle starting system.

Referring to FIG. 7, there is a computer 100, which can be a micro-controller or microprocessor, described in detail below, located on the vehicle for controlling the system operations. The computer has ROM memory for storing the application program to instruct the computer on the sequence of operations and also has RAM memory, which is used by the software system (program) in performing system operations. The computer 100 is also connected to a digital-to-analog converter 102, which converts the computer's output digital signals 124 to analog signals and transmits an analog control signal to the vehicle's alternator/voltage regulator 106. The alternator/regulator 106 is connected to the battery 108. A programmed current 116 or voltage is provided to the battery by the alternator/regulator under the control of the computer. This effects the battery charge. The alternator is monitored by a current sensing device, such as a shunt 110 and a voltmeter 112. The alternator/regulator is also connected to other components of the vehicle through the leads 114.

The current supplied to and drawn from the battery is monitored through the current flow measuring device 110 and the battery's response voltage 118 is continually measured by the voltmeter. The measured quantities are applied via an analog-to-digital converter (ADC) 122 to the computer. The output of a temperature sensor 130 for battery operating temperature measurement is also conveyed to compute via the ADC 122. There can be a multiplexer and associated conditioning electronics to convey the various signals to and from the ADC 122. Another computer data input is crankshaft speed for determining engine self-sustaining speed, this being derived from crankshaft rotation directly by a crankshaft sensor 132. Engine self-sustaining speed may be determined based on the signal from crankshaft sensor 132, which detects engine rotation, and is used to illustrate an implementation. Alternative means are an engine tachometer or a self-sustaining signal from the vehicle engine control unit.

Another sensor input 134 is from the vehicle ignition switch which indicates when the engine is not running (off), when an engine start cycle is pending ("on") and when engine stop is to occur. The "On" and "Off" ignition switch states (conditions) are sensed by a bi-state level sensor which, in turn, relays the foregoing conditions to the computer. The engine starter relay closure is also monitored by a bi-state level sensor 136. This signal indicates start of engine cranking and subsequently end of cranking when engine self-sustaining speed is attained.

The analog to digital converter 122 converts the analog measurements of voltage, current and temperature to digital signals 124 and transmits the digital signals 124 to the computer 100. A display 128 may also be connected to the computer to display this data.

The computer 100 has at least the following conventional functional elements: central processing unit (CPU) for execution and control, memory management unit (MMU), random access memory (RAM) for operations requiring temporary storage, read only memory (ROM) for program storage (PROM) ("programmed read only memory") is an alternate, electrically altered program read only memory (EAPROM) for data base storage and as an optional replacement for ROM, multiplexers for routing analog output signals to the analog-to-digital converter (ADC) 122 and digital control signals to the digital-to-analog converter (DAC) 124, sample and hold amplifiers, clocks for date and time information records, timing and control. The system level sensors (e.g., for bi-state sensing) are for detecting change in operation or mode conditions (e.g., ignition switch "On" or starter relay contact closure) or a response that may be used for special control or communication purposes, bi-state output signal lines (discretes) that indicate conditions or response that may be used for special control or communication purposes, and a communications port that this is applicable to the specific implementation (e.g., RS-232/4221485. IEEE-1394 or J1850) for communicating with other systems or displays, or for providing information to the vehicle diagnostic connector. There also is an interrupt system for initiating special routines needed to insure system integrity and operation. All of the foregoing is conventional and well-understood by those skilled in their use. Other conventional components are used as needed.

The preferred type temperature sensor 130 is a resistance temperature detector (RTD). RTDs are rugged, reliable and offer low cost implementation. Any existing ambient temperature sensor in a vehicle may be used. If the system is incorporated in a voltage regulator, the temperature-compensating resistor is a preferred approach.

The preferred shunt device 110 for measuring current and its flow direction is either the negative battery cable or the positive battery cable. Battery cables exist and are rugged and provide reliable service as a current measuring shunt. Using the cable as the shunt reduces cost and complexity. These battery cables by SAE and DIN standards respectively have 0.1 milliohm and 1.0 milliohm resistance. Alternatives available, but at higher cost and complexity, are Hall Effect and inductive type sensors.

The preferred embodiment of the system uses, or shares, any existing micro-controller or microcomputer already in a vehicle which has sufficient spare capacity and/or capabilities. The preferred embodiment also uses an existing temperature sensor where possible and practical, and a battery cable as a current sensor. Sharing a micro-controller existing in a voltage regulator is preferred because the temperature sensor does not require duplication. The signal indicating the start of engine cranking is commonly available and is used to excite excitation coils, and minimum connections are required to the system. This reduces system cost. A dedicated micro-controller can also be used. The micro-controller can use existing devices, communications protocols and communication buses in a vehicle for communicating with the display 128 and with other vehicle systems that could benefit from battery condition signals. For example, data from the system may be supplied to a vehicle's on-board diagnostic system and its diagnostic connector.

1. General Operation of the System

As explained below with reference to the flow charts of FIGS. 1–5, the system of the invention monitors and acquires voltage, current and ambient temperature during three operating modes. The first mode, which is referenced as, "Engine Sleep", is with the engine off. This mode is terminated when the ignition switch is turned "on". Transition of the system to the second, "Engine Start", mode occurs upon sensing closure of the starter relay contact. The Engine Start mode terminates upon receipt of the engine self-sustaining signal or a time-out abort command in the event an engine dies and does not attain self-sustaining speed. The crankshaft sensor is the usual device used for determining and/or indicating engine speed. Indications that an engine attained self-sustaining speed may be realized by monitoring the crankshaft sensor or from other on-vehicle systems such as the engine control computer. Attaining successful engine self-sustaining speed initiates the third, "Engine Run", mode. The Engine Run mode terminates with the sensing of the ignition "off" signal, that is, the engine is "off" (not running).

Following sensing of the engine being "off", the system enters into a period preceding the Engine Sleep mode. This precursor to the Engine Sleep mode is to allow orderly vehicle electrical system shutdown. The shutdown period allows a delay for automatic light turn-off and shut down of other components and functions which draw current from the battery. During each of the three modes and during shutdown, the system continuously corrects acquired data according to stored database factors, updates the database, issues advisory messages and/or indications and originates control signals.

2. Installation

Figure 1:
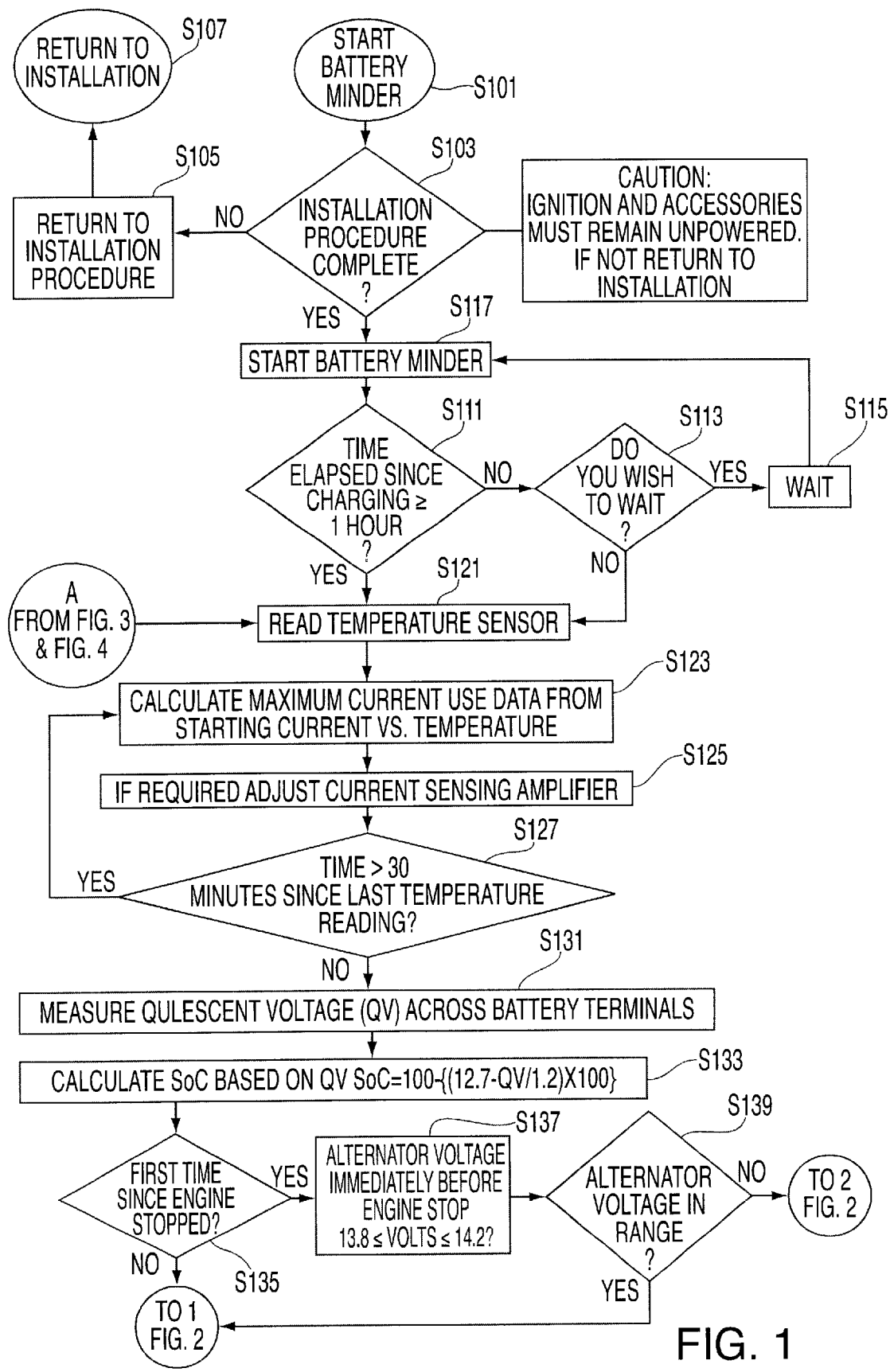
FIGS. 1–5 flow charts illustrating the operation of the invention with certain of these Figures composed of several sheets assembled as shown.

Referring to FIG. 1, steps S101, S103, S105, S107 generally describe the installation and initiation of operation of the program. These are the conventional steps of the physical installation of the program S101, and start of operation including initialization of the variables used on input of various data values and a check S103 to see if the program is installed and operating properly.

It is considered that the computer ROM contains battery performance data developed from external sources. This includes curves of SoC versus temperature and SoC versus IR; battery capacity rating, either in CCA (cold crank amperes) or ampere-hours, and starting current versus temperature. The vehicle type and battery identification number also are stored. The data on temperature, voltage and current sensing characteristics, and other baseline data can be placed in the computer EAROM section. If the data is not already present in computer storage, it can be entered. There is a return to the installation procedure S105 if it is determined that the installation is considered not to be complete, and then a return to a re-rerun of the installation in S107.

3. Start of Operation

In general, a newly installed or freshly charged battery requires time to stabilize, that is, to settle to its normal state. Some residual polarization effects may exist. Many variable factors are present, such as charging rate temperature, battery plate surface temperature, etc., which preferably should be permitted to settle down before any measurements are made. In the lead-acid battery used in an auto, the time to stabilize is generally considered to be about one hour. It is desired for the, system to operate to perform its various functions after the battery has reached a stable condition.

Assuming that the system is properly installed in S103, in S111 the user makes a decision as to whether the battery has stabilized, i.e., whether it was charged more than one hour ago. If the answer is NO, which can be entered manually, the user is given a chance in S113 to agree to wait, and this can be displayed on the display 128. If the answer is YES, a waiting time is started in S115.

If a YES is the result of S111, or after the required time has elapsed in S113 and S115, the system is started in S117. A decision can be made in S113 not to wait the time for the battery to stabilize. If this is done, the analysis may not be as accurate for the time during which the battery is still seeking a steady state condition. For a YES from S111 or a NO from S113, the system proceeds to S121.

4. Acquisition of Data

The remainder of FIG. 1 basically relates to the acquisition of data and the computation of certain parameters that are acquired during the Sleep Mode (engine off) and are to be used by the system. The system continually makes the date acquisitions, such as determining time, battery voltage and current, and makes computations, such as every 50–100 milliseconds. Any suitable time can be used. The results are stored in the computer memory and are available for use in other parts of the program.

In S121 the ambient temperature data is acquired. This is provided by the temperature sensor 130. When an engine is started, the current drawn depends upon the ambient temperature. Generally, as the ambient temperature decreases the energy needed to start an engine increases. Also, the battery's internal resistance (IR) is inversely proportional to its output capability. Basically, the ability of the battery to start the engine decreases as the ambient temperature decreases and a point can be reached where the battery cannot start the engine. As previously described, a curve corresponding to maximum starting current versus ambient temperature is pre-programmed in the computer database. This can be in the form of a lookup table.

From the stored data the computer calculates in S123 maximum current use data for starting current versus the measured ambient temperature. In S125, if needed, the current sensing device 110 is adjusted, such as by setting the gain of an amplifier, so that during the Sleep Mode (i.e., before engine cranking) discharge currents are made to be of a low value as compared to current during engine cranking. Consequently, with a small current through a battery cable (or any other current sensor) which acts as a measuring shunt, the voltage drop (current×resistance) across the shunt 110 is relatively small. Such a low level voltage requires amplification. Conversely, during cranking where the current is large, especially at low ambient temperature, the voltage drop across the shunt is large. When ambient temperatures are in the plus 20 Degree Celsius range, cranking currents may be half that produced during a low temperature. Therefore, amplifier gain must be adjusted for the operating mode and conditions. Values to accomplish this are stored for use.

In S127, if the time from last performance of S123 and S125 is greater than a predetermined time, here illustratively 30 minutes, the steps S123 and S125 are repeated based on a more recent ambient temperature measured in S121 to use with the curve values in computer memory.

In S131 the quiescent voltage (QV) across the battery terminals is measured. QV is the measured voltage with the possibility of there being some current drain caused by some vehicle standby function, such as a security system. Open circuit voltage OCV, is measured when the battery is not connected to any load. OCV is frequently used to determine SoC. Most vehicles always draw a small amount of current. It has been found that QV is a valid parameter for determining SoC when the current drain is small, such as from 0 to 100 milliamperes. Therefore this validated linear relationship between QV and SoC is used by the system to re-calibrate and update itself and its database. QV is only valid when a vehicle is in the Sleep Mode.

In S133 the battery state of charge (SoC) is computed. The computer determines SoC on the basis of the formula:

$$SoC_{inpercent} = 100 - \left(12.07 - \frac{QV}{1.2}\right) \times 100$$

The concept for using the battery terminal voltage, specifically OCV, to compute SoC is discussed in the aforesaid patents, U.S. pat. No. 4,937,528 and U.S. Pat. No. 5,049,803. OCV by definition requires a battery to be disconnected from all loads. Disconnecting a vehicle battery from all vehicle systems causes many unacceptable user problems. In addition, disconnecting a battery prior to OCV measurements and subsequent re-connection, requires initialization of many systems including the security system, re-entry of various settings, such as preferred stations, seat memory and more. Whereas in the present invention, QV is used and is accurate for the reasons explained above. Using QV for determining SoC avoids all the aforementioned problems. A more important user advantage is real time battery condition determination and reporting.

In S135 a check is made to determine if the system program is running for the first time since engine shutdown. If the decision is "YES", then program execution continues at S137 for the beginning of alternator performance evaluation prior to engine shutdown. If the S135 response is "NO", battery monitoring continues at S211 in FIG. 2.

Figure 2B:
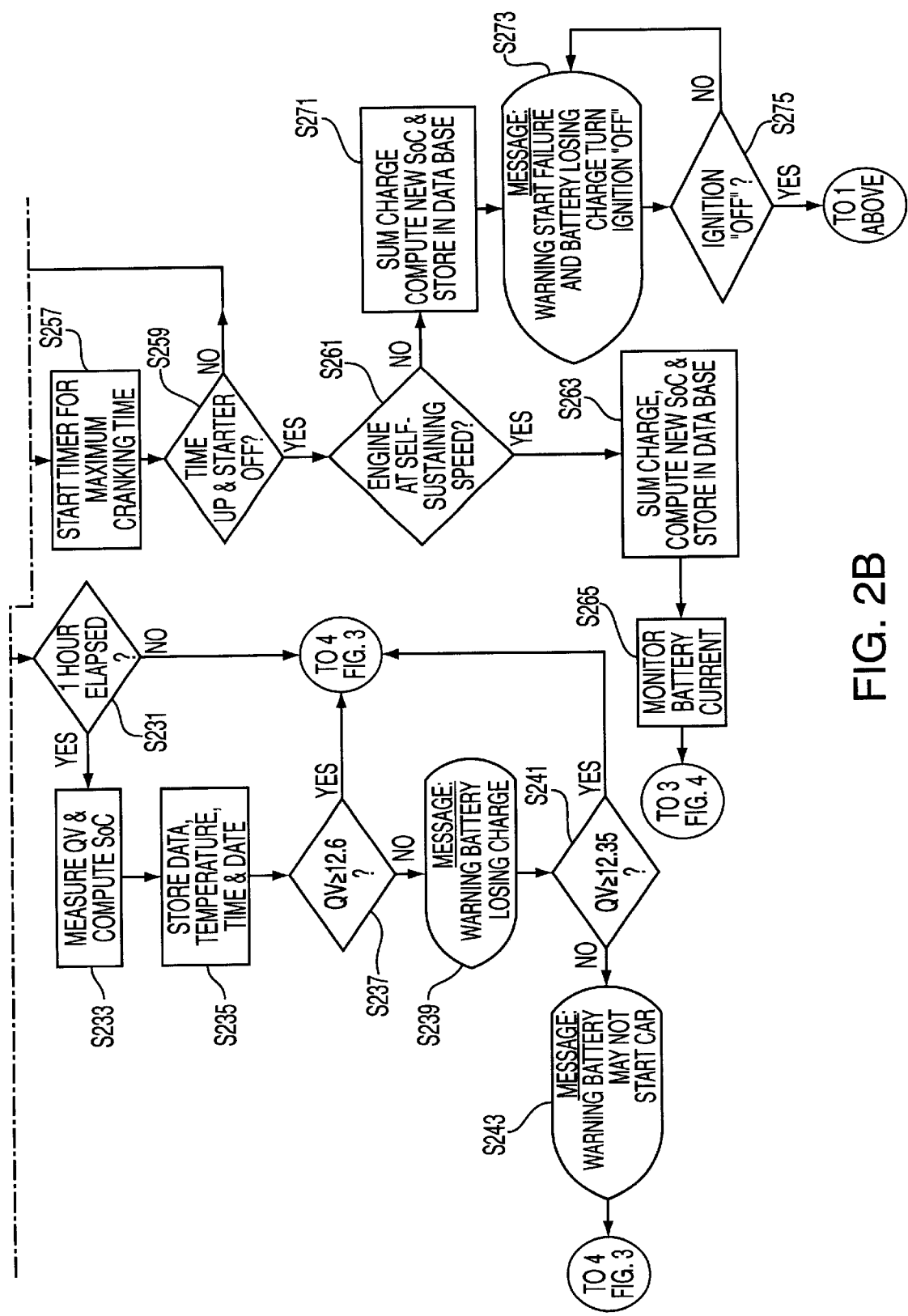
Figure 3:
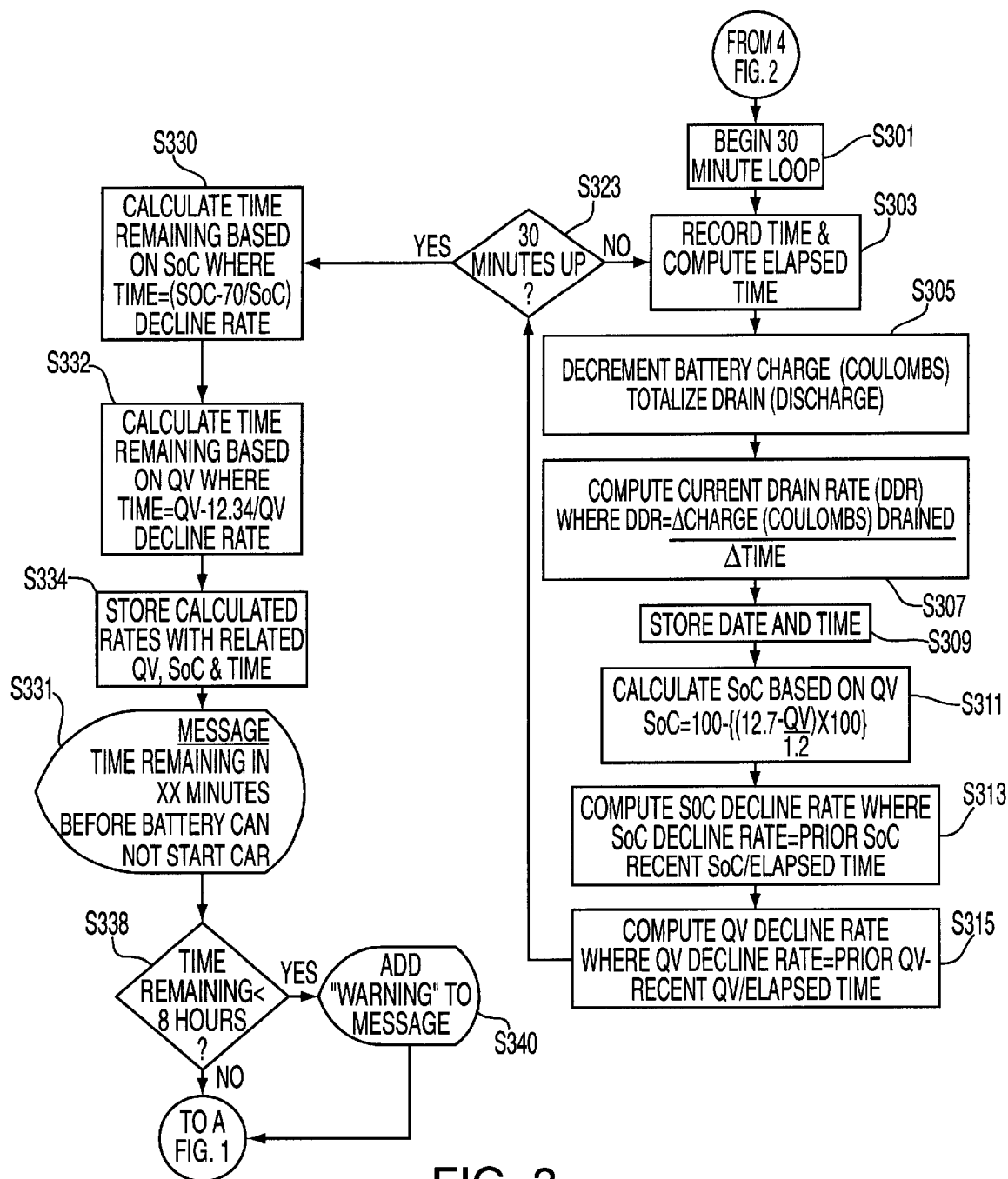

The S135 "NO" determination results from program recursive entry from "A" on FIG. 3 to "A" on FIG. 1. The "YES" response results from re-entry from "A" on FIG. 4 where previously the program determined that the engine ignition had been turned "OFF" immediately prior thereto. A "NO" in S135 causes the program to proceed to entry point 1 of FIG. 2.

A normal alternator output voltage is between 13.8 and 14.2 volts. The alternator output voltage is monitored and the updated value stored on a frequent basis. The last voltage measured prior to engine turn-off is in the computer database. If the alternator voltage is in the normal range, as determined by a YES decision in S139, the program proceeds to point 1 of FIG. 2. If the alternator voltage is out of range, the program proceeds to point 2 of FIG. 2.

5. Determination of Alternator and Belt Operating Condition

FIG. 2 shows several of the uses of data previously acquired by the portion of the program in FIG. 1 and from FIG. 4, which is to be described. Steps S201–S209 provide data relative to the condition of the alternator-regulator combination and its belt, and the need to charge the battery.

A NO determination at S139 corresponds to the alternator output voltage, immediately prior to engine shutdown, being out of normal range (13.8V to 14.2V). This measured alternator voltage is carried to entry point 2 of FIG. 2 for a series of evaluation and decision steps at S201–S209. The battery can only be charged to the value of the output voltage of the alternator. The steps S201–S209 are for the measured battery QV being below the low end (13.8V) of the alternator output range. There are several possible conditions. If:

1. QV is less than 12.6V (S201) and greater than 12.4V (S203) a warning is produced in S205 for the display 128 to the effect that the "Battery Has a Low SoC and the Alternator Should be Checked".
2. QV is greater than 12.6V (S201) a message is displayed in S207 that the "Alternator Belt Should be Checked".
3. QV is less than 12.6V and also less than 12.4V (S203), a message is displayed in S209 that the "Battery Needs a Recharge, and Alternator and Alternator Belt Should be Checked". Usually, if QV is equal to or greater than 12.4V, the battery probably has sufficient capacity to re-start the engine since it was only recently shut down (S135 was YES). If QV is below 12.4V, the possibility of engine re-start is doubtful.

Accordingly, in S201–S209, the user is warned of possible problems with the alternator, alternator belt and battery charge.

In FIG. 2, for entry point I from FIG. 1, the alternator voltage is in the normal range. In steps S211 and S213 the program housekeeping and monitoring tasks are performed as indicated by the included legends. The entries into the database made during execution of S211 and S213 include QV and computed SoC, the status messages of S205, S207 and S209 and the time and date of the display of such messages are stored in computer memory. Therefore, a record is made of the possible problems of S205–S209 and the QV and SoC conditions.

6. Determination of Excessive Battery Current Drain

As previously explained, current is always being drawn from the battery, even with the ignition off. In step S213 continuous monitoring of the ever present current discharge is initiated and continues until terminated by an "Ignition On"—YES response in step S215 of the program. This monitoring is accomplished with the ADC, multiplexer, amplifier and current Measuring Shunt depicted in FIG. 7. Where the step S215 response is NO, current monitoring continues. Subsequent evaluations are made in steps S217 and S219. Step S217 determines if current drain is within allowable limits. If drain is within limits, execution continues at S219, which determines if the vehicle is in the Sleep Mode. If the response is NO, a warning message is issued in S221 "Check Vehicle For Cause of Current Drain" and transmitted to display 128 in FIG. 7. Time is allotted for such cases where lights remain ON between the engine being shut down and entry into the Sleep Mode. Engine time off is taken from the time and date stamp recorded in S468 in FIG. 4.

Program execution from steps S217, S219 and S221 continues in step S231, where a one hour time check is applied. This time is variable according to vehicle requirements in the embodiment being described and the one hour time is used to permit both stabilization of the vehicle including its battery, and to allow time for meaningful trend analyses of possible battery degradation, as depicted in FIG. 3 to be described, while avoiding saturation of the database with unnecessary entries.

If the time of S231 has elapsed, in S233 QV is measured and SoC is computed. In S235, these two values are stored in computer memory together with the temperature, time and date. In S237, if QV as measured in S233, is equal to or greater than 12.6V, then the program proceeds to entry point 4 of FIG. 3. If QV is less than 12.6V, S239 initiates a message on the display 128 warning that the "Battery May be Losing Charge". That is, there is an excessive current drain even if the vehicle is in the Sleep Mode (quiescent) state as indicated by S219. An investigation can be made for an abnormality, such as lights or certain auxiliary equipment being left on.

Decision step S241 follows S239 which is a "NO" result from S237. The S237 "NO" result signifies QV is less than 12.6V. If S241 determines QV is less than a predetermined voltage here illustrated as 12.35 volts, although the voltage could be lower, such as 12V, execution proceeds to S243 which initiates a message on display 128 that the "Battery Might Not be Able to Start the Engine". The value of 12.35V may vary somewhat for different engines which drain different amounts of current when starting. This also is passed to entry point 4 of FIG. 3. If in S241 QV is equal to or greater than 12.35V, which means that the battery probably can start the engine, this is entered at entry point 4 of FIG. 3.

Returning to S215, if the ignition switch is "on", the system has entered the second mode, Engine Start . In S251, a program loop that includes S253 is started. This loop checks for starter relay contact (136 in FIG. 7) closure. When closure occurs, the program moves to S255. When the starter relay contacts close, electric energy is supplied to the starter motor and the engine start begins. In S255 the battery voltage and output current are monitored at a high sampling rate to acquire the data to compute dynamic IR and PR. The high sampling rate assures capture of the resulting current and voltage waveforms as depicted in FIG. 6.

As indicated in FIG. 6, typically several thousand voltage and current measurements are made during the aforementioned voltage and current monitoring. Preferably, a multiplexer under program control is used to enable alternate measurement of voltage and current with the ADC. The multiplexer switching rate is generally equal to the signal sampling-rate. As voltage and current measurements are acquired they are stored in microcomputer RAM, preferably in a specifically allocated area, for subsequent determination of dynamic IR and PR. The determination of dynamic IR and dynamic PR is described below using FIG. 6 as a reference.

FIG. 6 depicts two curves denoted as the voltage and current waveforms that are plots of voltage and current measurements acquired during a successful engine start. The significance of points A, B and C and A', B' and C' is explained below.

A, B and C respectively correspond as follows:

"A" indicates battery voltage immediately prior to starter relay contact closure.

"B" indicates the region where battery voltage samples are taken that are to be subsequently used for IR determination. This region follows the large voltage drop and sharp but partial recovery. This phenomenon is due to the inrush of current into the starter motor which is then motionless—stalled.

"C" indicates where self-sustaining speed~"engine idle" occurred and the voltage that is subsequently used for dynamic PR determination.

Points A', B' and C' respectively correspond as follows:

A' indicates battery current immediately prior to starter relay contact closure.

B' indicates the region where battery current samples are taken that are subsequently used for IR determination. This region follows the very large current outflow and then a small series of declining current outflow. This curve depicts the current inrush into the starter motor while it is motionless—stalled, followed by a series of declining current outflows as the motor begins rotation, later followed by engine energy contributions.

C' indicates where self-sustaining speed—"engine idle" occurred and the current that is subsequently used for dynamic PR determination.

The current and voltage curves depicted in FIG. 6 for a typical engine start have a large number of points of inflection (i.e., peaks and valleys). These points of inflection are more prominent on the current curve—waveform. These are due to several dynamic phenomena. The starter motor causes the initial out-rush of current as indicated above when in a "stall" condition. As the motor rotates, current flow decreases. Superimposed on this current outflow are the engine torque contributions resulting from the engine cylinders igniting. The starter motor and the engine also affect the voltage curve as it starts. All electric motors (e.g., a traction motor in a battery powered vehicle, or an electric drive motor in a hybrid powered vehicle) cause large current in-rushes during the starting. Therefore the following method for determining dynamic IR and dynamic PR is also applicable.

The dynamic influences of the starter motor and engine require a different method from the method for determining IR and PR as described in previously cited U.S. Pat. No. 4,937,528 and in U.S. Pat. No. 5,049,803.

The current and voltage curves of FIG. 6 are sampled at a high rate and the data from the measurements is sequentially stored in memory.

The methodology for determining dynamic IR accounts for the dynamic influences previously cited and is, as follows:

1. Point A on the voltage curve is established by analyzing the curve to determine when (time) the voltage first decline ended and where the voltage remained relatively constant before the large decline indicated in FIG. 6. Time is determined from the table in RAM that stores the measured voltages. Each measurement is sequentially stored in memory and, preferably, only one measured value occupies a memory location. The memory location with respect to the initial stored measured quantity establishes the relative time with respect to the initial measurement. Thus, the voltage at A and its relative time are established.

2. Each current measurement has a corresponding memory location for the time concurrent voltage measurement. The same relative voltage memory location (time) for Point A is used to access that relative memory location for the corresponding current for A'.

3. The initial value for B is established based also on an analysis of the stored measured data. The location of this initial point B' is where rapid voltage increase ends after a steep decline as indicated in FIG. 6.
4. The time location for the B' initial or starting point is derived from the corresponding B memory location.
5. For a time duration, illustratively of 100 milliseconds (0.1 second), or other time duration determined as necessary, the current and voltages measurements stored in sequence are averaged including the initial measurements.
6. The absolute difference between A and the average of B (i.e., $A-B_{average}$) is computed for the voltage. In a similar manner the absolute difference between B' and A" (i.e., $A'-B_{average}$) is computed for the current.

Dynamic IR is determined by dividing the resulting current difference by the resulting voltage difference, as indicated in the following expression:

$$\text{Dynamic IR}=(A'-B'_{average})/(A-B_{average})$$

A similar technique as described above is used in determining polarization resistance (PR). C and C' on FIG. 6 are the respective points on the voltage and current curves used in this computation. Locating these points is accomplished in a manner similar to that for locating A and A', as described above. Somewhat like locating A, the location of C occurs where the voltage curve slope is zero, prior to the steep rise to almost the initial voltage as indicated in FIG. 6. These respective values of voltage and current (i.e., C and C'), as described in the previously cited patents, cannot be used without compensation. The voltage drop due to IR causes a countering effect that must be accounted for when computing polarization resistance (PR). This battery IR drop is counter to the PR induced voltage drop. Since these two effects are in opposite directions, the polarization calculation must account for the countering influences when computing the actual PR.

The previously described Dynamic IR is used for determining the countering IR voltage drop and is subtracted from the voltage at C before computing PR by using the relationship:

$$\text{Dynamic PR}=(C_{volts}-(IR \times C'_{Ampere}))/C'_{Ampere}$$

Thus, both dynamic IR and PR are available for other purposes. In S257, with the ignition "on" and engine cranking initiated, a timer is started to set a period that exceeds normal cranking time. This predetermined time, for example the time for two revolutions during cranking plus an increment, is intended as a default condition in the event an engine does not attain self-sustaining speed. Monitoring of voltage and current was initiated (although possibly redundant) in S255 for the S257–S259 loop and subsequent steps. If either the default time expires or cranking ends, then S259 causes the program to advance to S261.

Step S261 determines if the engine is self-sustaining, i.e., running at a normal idle speed). Engine speed may be determined directly by monitoring the pulse output of the crank position sensor, or from another vehicle source such as the engine control computer or engine tachometer or even pulses from an alternator. When monitoring pulses, speed is determined by counting pulses for a unit of time (e.g., seconds). For example, where a sensor produces a pulse per second, 10 pulses counted during 1 second indicates speed is 600 revolutions per minute. The time period between pulses, which is the reciprocal of pulses per second, can also be used. This latter method usually provides a more rapid indication. If the engine is at self-sustaining speed, step S261 (YES) advances the program to S263. This step, like S213, monitors the current drain and computes a new SoC value, which is stored in the computer database. The program then advances to S265 where battery current monitoring is resumed. Information is passed to entry point 3 in FIG. 4.

If S261 determines that the engine speed is not self-sustaining, then in S271 a new value of battery SoC is computed and stored in the database. S273 initiates a message for display 128 of "Start Failure and Battery Losing Charge—Turn Ignition Off". The message stays on until S275 determines that the ignition switch has been turned "off". With the ignition switch "off", there is an entry of the S271 data and S273 message at point 1 of FIG. 2.

7. Battery SoC and Useful Time Remaining

One of the distinguishing features of the present invention is the ability to predict future battery performance. For example, vehicle owners and operators frequently need to know how long an unused vehicle can remain parked and the battery still be able to start the engine. Predicting the expected remaining life before battery replacement is required is another important prediction for owners and operators. This part of the program is described with respect to entry point 4 in FIG. 3.

The procedures in FIG. 3 take place during the time that the engine is not running, that is, in the Sleep Mode. This provides real time condition reporting and appropriate alerts regarding potential loss of capability and the need for corrective action. S301 is the beginning of the calculation for the time remaining, here indicated in minutes, that the battery can be used to start the engine without further charging. That is, the battery will be in a condition with a charge sufficient to start the engine up to the end of the computed time period. This is based on the decrease, or decline, of the value of the battery SoC and confirmed by the value of QV at that time.

In S301, a loop of a given time, here illustratively 30 minutes, is started during which the various steps S303–S315 in FIG. 3 are repeatedly executed until the foregoing time expires as determined in S323. Entry into this loop results from an output from either S231, S237, S241 and S243 in FIG. 2.

S303 enters in the database the start time for the possible one or more subsequent loops. In addition the elapsed time since the looping start is computed. This elapsed time is used in S323 for terminating the looping.

In S305, the battery SoC is decremented on a continuous basis by the totalized, or sum, of the drain. Battery drain, charge and capacity are expressed in any one of the following measurement units: ampere-hour, ampere-minute, ampere-second, or coulombs. One coulomb=one ampere-second or one ampere=one coulomb per second. Coulombs are the preferred measurement units. Battery capacity is frequently specified in Ampere-Hours. Battery capacity can be expressed equivalently in coulombs, i.e., 1 ampere-Hour= 3600 coulombs. For example, an 80 ampere-hour battery at a 100% SoC holds a possible charge of 288.000 (80×3600) coulombs at normal conditions. Accordingly, a battery of this capacity at an 80% SoC would be expected to hold a charge of 204,000 coulombs at normal conditions. If a battery charge based on the assumption of 80% SoC (corrected for ambient conditions) were to be decremented by 3600 coulombs, that battery would now have a 79% SoC, also corrected for ambient conditions.

Since the current flow (drain or charge) is measured by device 110 in amperes and the computer has a clock, there can be an accurate calculation of this quantity. The current drain in coulombs is continually measured in S305. S307 computes the value of the battery discharge drain rate (DDR) as $$DDR = \frac{{}^a Charge}{{}^a Time}$$

Measuring the change in the charge between two points in time determines DDR. The DDR data is stored in S309 with the date and time. The DDR can be averaged at various times if desired, such as over the 30 minute period set by S301 if desired.

In S311, the SoC is calculated on the same basis as S133 using the formula:

$$SoC = 100 - \frac{(12.7 - QV)}{1.2} \times 100$$

In S313 the SoC decline rate is computed as:

$$SoC\ DR = \frac{Prior\ SoC - Recent\ SoC}{elapsed\ time}$$

That is, the rate of SoC decline is the difference between an earlier measured SoC value and the current measured SoC value divided by the time between measurement of the two values. The time interval can be any number of time units, such as minutes, as needed. The SoC DR can also be averaged to improve accuracy. The SoC can be obtained from S133 as needed.

The two procedures of determining DDR and SoC DR are similar and basically are measurements of points defining a slope of a line.

In S315 the QV decline rate QV DR is computed as:

$$QV\ DR = \frac{Prior\ QV - Recent\ QV}{Elapsed\ time}$$

Here, the prior QV can be obtained from S131 and the elapsed time can be one, five or ten minutes or any other time as required by the accuracy desired. Again, QV is measured with all major electrical components shut down.

After the 30 minute-time limit initiated in S301 expires, as determined in S323, the data computed in the loop of S303–S315 is used in S330–S340. In S330, the time remaining before a battery can no longer start an engine is computed based on the SoC data as $$Time\ Remaining = \frac{(SoC - 70)}{SoC\ DR}$$

The SoC is the most recent calculation of SoC and the SoC decline rate is computed in S313. The value of 70% SoC is used here. 35% to 50% SoC is usually the lowest SoC at which a battery has sufficient capability to support starting. Engines of smaller or larger displacement may require a higher or lower percentage of SoC.

In S332, the time remaining before a battery can no longer start an engine is also computed based on the QV and QV DR data as $$Time\ Remaining = \frac{(QV - 12.34)}{QV\ Decline\ Rate}$$

The QV is the most recent measured QV (S131) and the QV decline rate is computed as above. The factor, 12.34 is the QV for a battery at 70% SoC. The time remaining values computed relying on each of SoC and QV should be the same, or close. The Time Remaining is displayed in S336, illustratively in minutes. Other time units can be used.

Storage in the database of the foregoing calculated rates and their associated QV, SoC and time is implemented in S334. This information is then available through a diagnostic connector for diagnostic, maintenance and repair purposes.

In S338, the computed remaining time for a certain engine start, from S336, is checked to determine if it is less than a specified safety time limit. Eight hours is used as an illustration. If the computed remaining time is less than 8 hours, an optional warning message can be displayed in S340. Eight hours is an estimated time value for a battery to lose its ability for an engine start. Any number of reasons could be the cause for a battery to lose its engine starting capability while in the presumed Sleep Mode. For example, vehicle lights may be intentionally or unintentionally left on after engine shutdown or an entertainment or some other type of electric energy consuming device is used during engine shutdown.

If the computed time remaining is determined in S338 to be greater than 8 hours, then this indication is passed to entry Point A in FIG. 1, where system operation resumes as previously described.

8. Maintenance of Battery

Batteries are normally expected to wear out after a finite number of discharge and re-charge cycles, and also due to a wide-range of hostile environment and misuse conditions. When battery terminal connections or other connections associated with a battery and its alternator lose their "gas tight" quality (frequently used term for defining a characteristic of a high reliability connection), many deleterious conditions may result. The initial consequences of loss of "gas tight" integrity is an increase in contact resistance. This in turn may cause further contact degradation and greater resistance. Loose connections, where thermal cycling conditions are aggravated by heating due to carrying current, are more subject to corrosion. The consequence is never ending cycles that lead to high resistances that essentially cause the voltage supplied to the vehicle starter to decrease and ultimately to be incapable of providing needed power. In addition, corrosive fluids, such as battery electrolyte, may drip or precipitate on connections and cause corrosion. Under any of the foregoing conditions, high resistance leads to large voltage drops that interfere with power delivery to the vehicle starter. The above conditions do not suddenly appear unless there is an incident of a large impact or intense vibration. Rather the deterioration occurs over relatively long time periods.

Referring to FIG. 7, the positive and negative battery terminal voltage sensing wires of the diagnostic system can be connected to the battery's positive and negative lead wires respectively near the end of the wires connecting to the battery terminals. Therefore, the measured internal resistance IR will include all resistance from the positive lead wire end to the negative lead wire end including the contact resistance between the wires and the battery terminals. The battery IR generally remains within a narrow range as long as the battery SoC is above 70% and the battery has not substantially lost capacity. A preferred embodiment of this invention initiates a display that advises the driver to inspect, clean and tighten the battery terminals when the determined IR is larger than a predetermined value as, for example, more than twice the normal initial IR of the battery at a given temperature.

This aspect of the invention is described with respect to FIG. 4, where the engine is running, that is, the system is in the Run Mode. All IR determinations are and can only be made as the consequence of engine cranking as depicted in FIG. 6. The designation current IR means the IR that was determined for the recently completed engine start. The term initial IR can be applied to the last engine start or any other previous engine start. It is preferred that each computed dynamic IR be stored in the computer database for future use. However, as used in the preferred embodiment of the system, the initial IR is the very first IR determined after installation of that battery. The initial IR can also be the dynamic IR of a battery after servicing or after cleaning and tightening connections.

In Step S402, the IR rate of change is computed on the basis of $$IR\ Rate = \frac{Current\ IR - Initial\ IR}{\Delta\ time}$$

When IR increases and PR decreases, the probability exists that a high resistance is occurring in series with the battery. Such resistance increases are usually associated with loose or corroded connections. IR increases are influenced by many conditions including plate corrosion, loss of active material and plate area, and low temperature. The IR of a battery is an indicator of its capability to store and deliver electric energy. A high or increasing IR indicates diminished or diminishing capability. When IR is high and there are low temperatures, both cause increases of IR and much greater engine starting loads. Therefore, the potential for engine starting rapidly decreases with lowering temperatures. Since IR primarily increases with age or with degrading operating conditions, an excellent indicator that a battery's service life is ending is its low temperature starting limit. All of this data is stored in computer memory to provide needed diagnostic information required for maintenance and for user warnings.

In S404, IR, IR Rate and the time of computation of the IR Rate are stored. In S406, a determination is made as to whether or not the IR is increasing. That is, if the result of S402 (IR Rate) is positive, then this is an indication that the IR is increasing. The highest rate is selection in S408 and is used in S420.

In S410 PR is computed, and in S412 the PR Rate is computed as $$PR\ Rate = \frac{Current\ PR - Initial\ PR}{\Delta\ time}$$

where the Current PR is the last value measure and the Initial PR is the one made at a prior time, as discussed above.

In S414, the computed PR value and the time of computation are stored. In S416 a determination is made whether the polarization resistance PR is increasing, that is, if the result of S412 is positive. If it is increasing, then the highest rate (computed during S412) is selected in S418 for use in a determination step S420 of both IR Rate and PR Rate.

In S420 a check is made to see if both of the quantities of the IR and the PR are increasing. The data for this is obtained in steps S406 and S416. If both these quantities are increasing, then there is initiation of the display of a message in S422 to "Check Electrolyte—Low Electrolyte Causes Plate Corrosion". The reason for this conclusion is that a low electrolyte level is generally caused by water loss which may be caused by high temperature or electrolysis due to over-charging. Low electrolyte level leads to higher current per area of the plates. Electrolyte concentration increases and available plate area is reduced. Reduced plate area leads to greater PR. Reduced plate area along with higher concentration leads to greater IR. The output data message of S422 is entered at entry point 5 in FIG. 5.

If both IR and PR are not increasing, as determined in S420, the program execution advances to S424 (FIG. 4C) where a further analysis is made to determine if the internal resistance (IR) is increasing and the polarization resistance (PR) is decreasing. If this situation prevails, that is a YES, then in S426 a message is displayed regarding "Possible Terminal Corrosion or Loose Connections". The reason for this determination is that loose or corroded terminals cause an apparent increase in IR and lower current. Lower current reduces PR. This message is also entered at point 5 in FIG. 5.

If the reverse situation prevails, that is, the PR is increasing and IR is decreasing, there is a NO result in S424, the low starting temperature limit is determined and passed to Step S428 for inclusion in the message "Low Starting Temperature XX Degrees". The number of degrees, in either Celsius or Fahrenheit, fills the message field, "XX" and is the quantity passed from the aforementioned low starting temperature limit process.

Low Starting Temperature Limit is determined from two data sets in the computer. A performance requirement data set is derived from a sample, or preferably sample lot, of a vehicle of the type and engine configuration in which the system is installed. The vehicles used to generate the performance requirement data are started at uniformly distributed temperatures that extend from the lowest expected temperature to the highest temperature. This process is usually employed when batteries are qualified for vehicle use by manufacturers. The resulting current and voltage data is similar to that depicted in FIG. 6. These currents and voltages are then used to compute what is hereafter referred to as "Demand IR".

The Demand IR is stored in the database with the related temperature. From battery static IR (computed at no load and OCV) data for a similar temperature range, a temperature compensation for dynamic IR is entered into the database along with the characteristic data for battery IR at various temperatures. The temperatures acquired in S121 are used as a temperature compensation factor in the database for subsequently characterizing the battery characteristic data. During normal and usual operation the computer seeks a match where a value in the Demand IR data is matched by the "just acquired" dynamic IR as adjusted by the foregoing temperature compensation. Where a match occurs, the stored temperature for that demand IR becomes the temperature of the low starting limit.

Figure 4A:
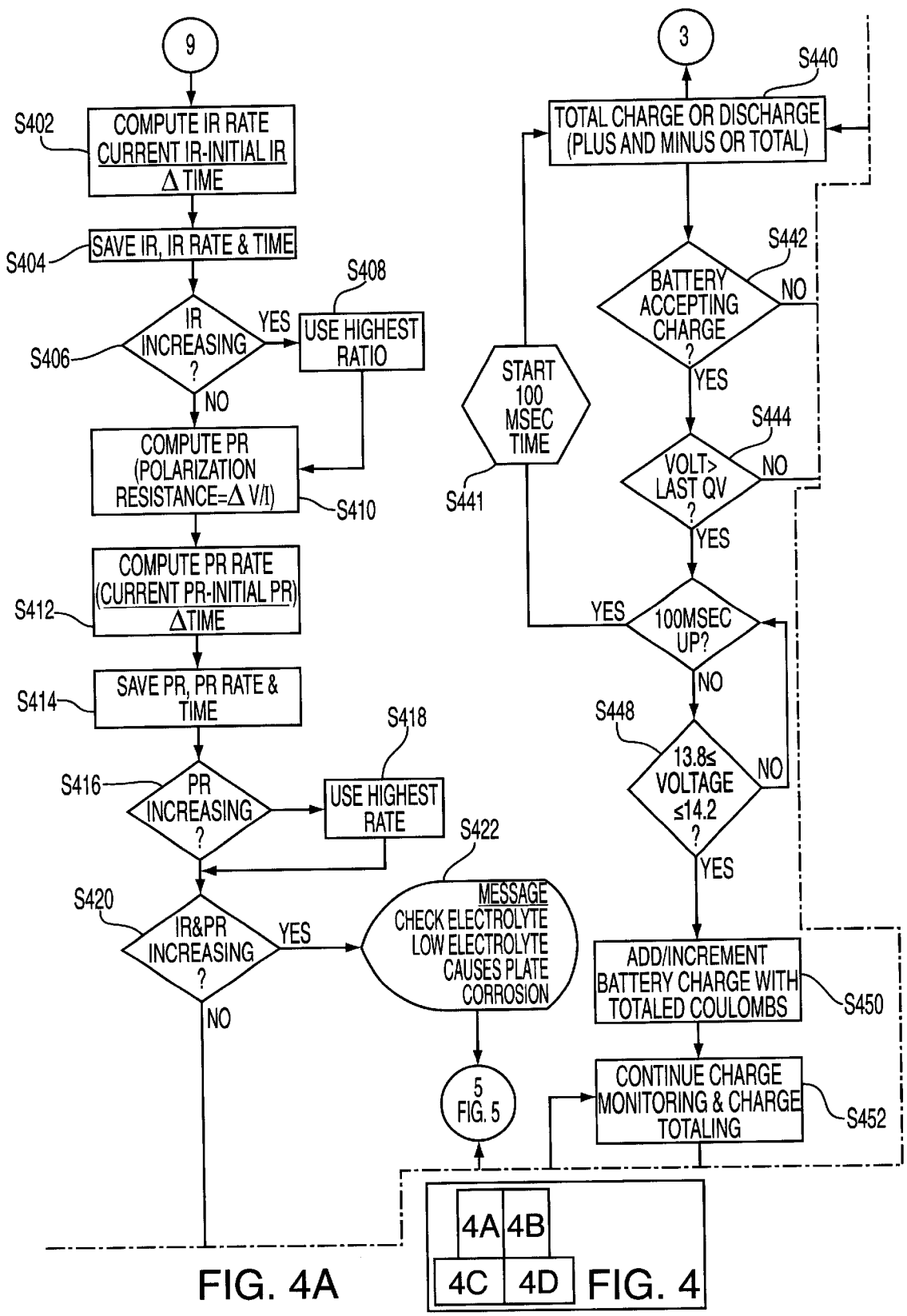
Figure 4B:
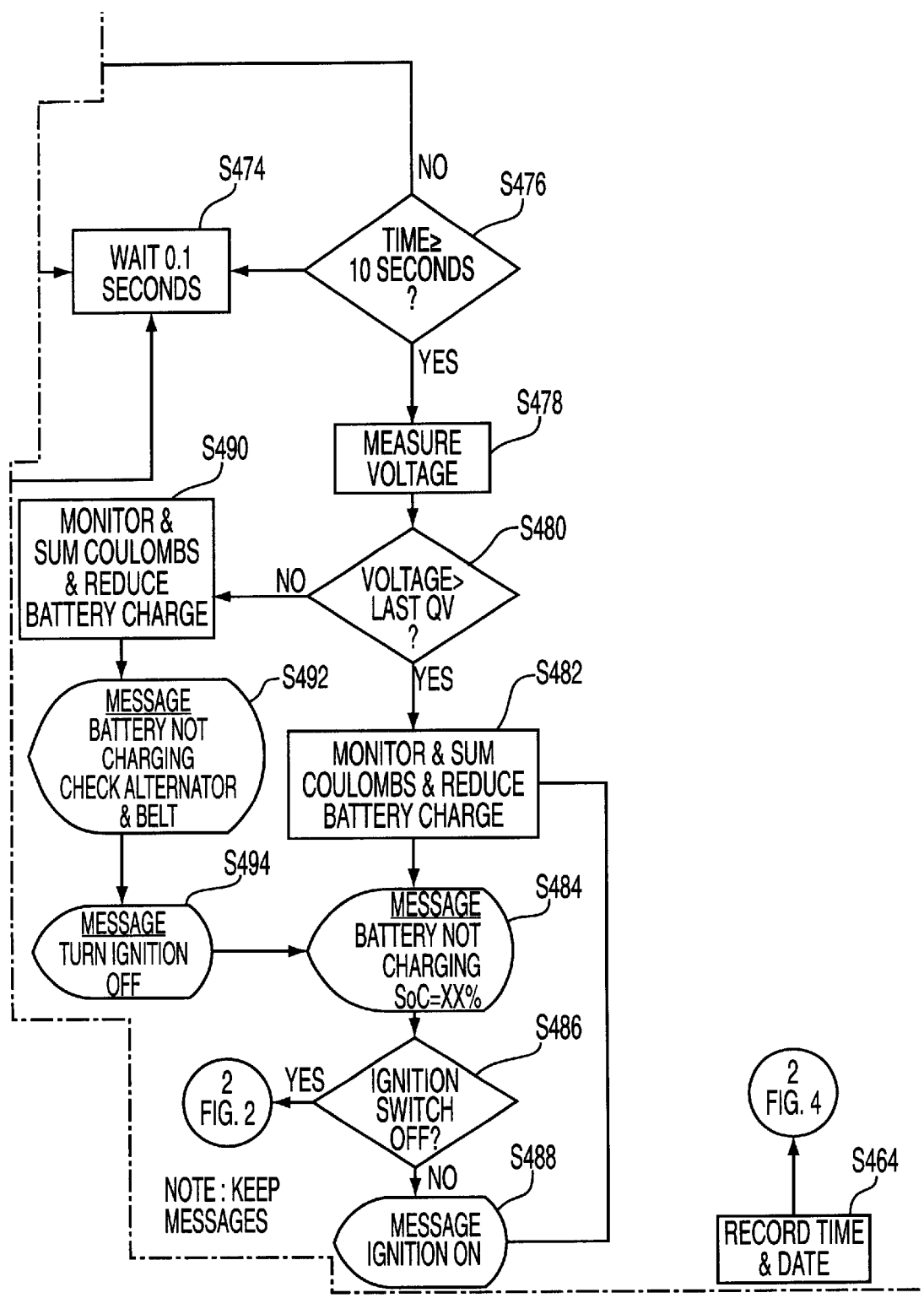
Figure 4C:
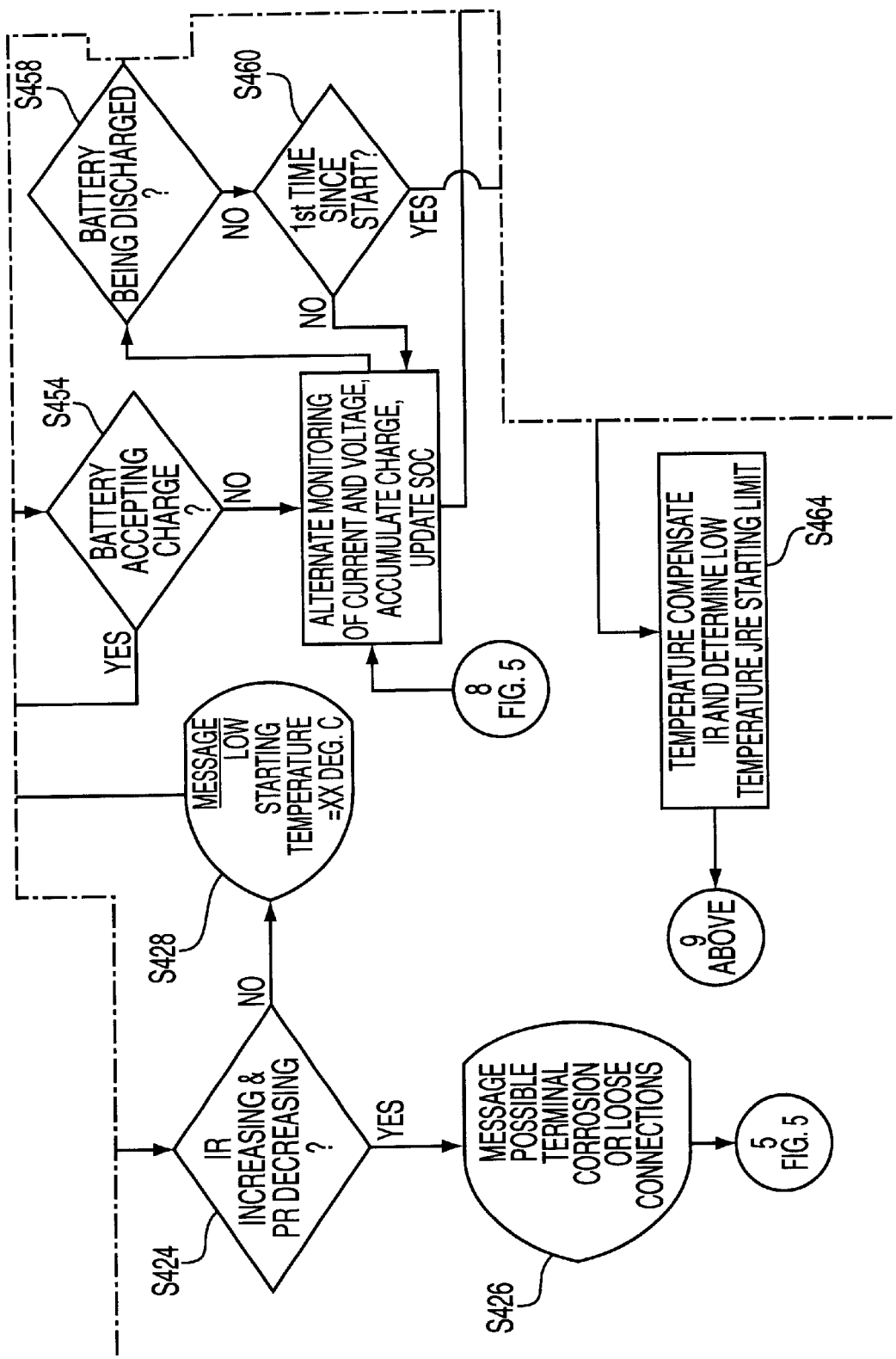
Figure 4D:
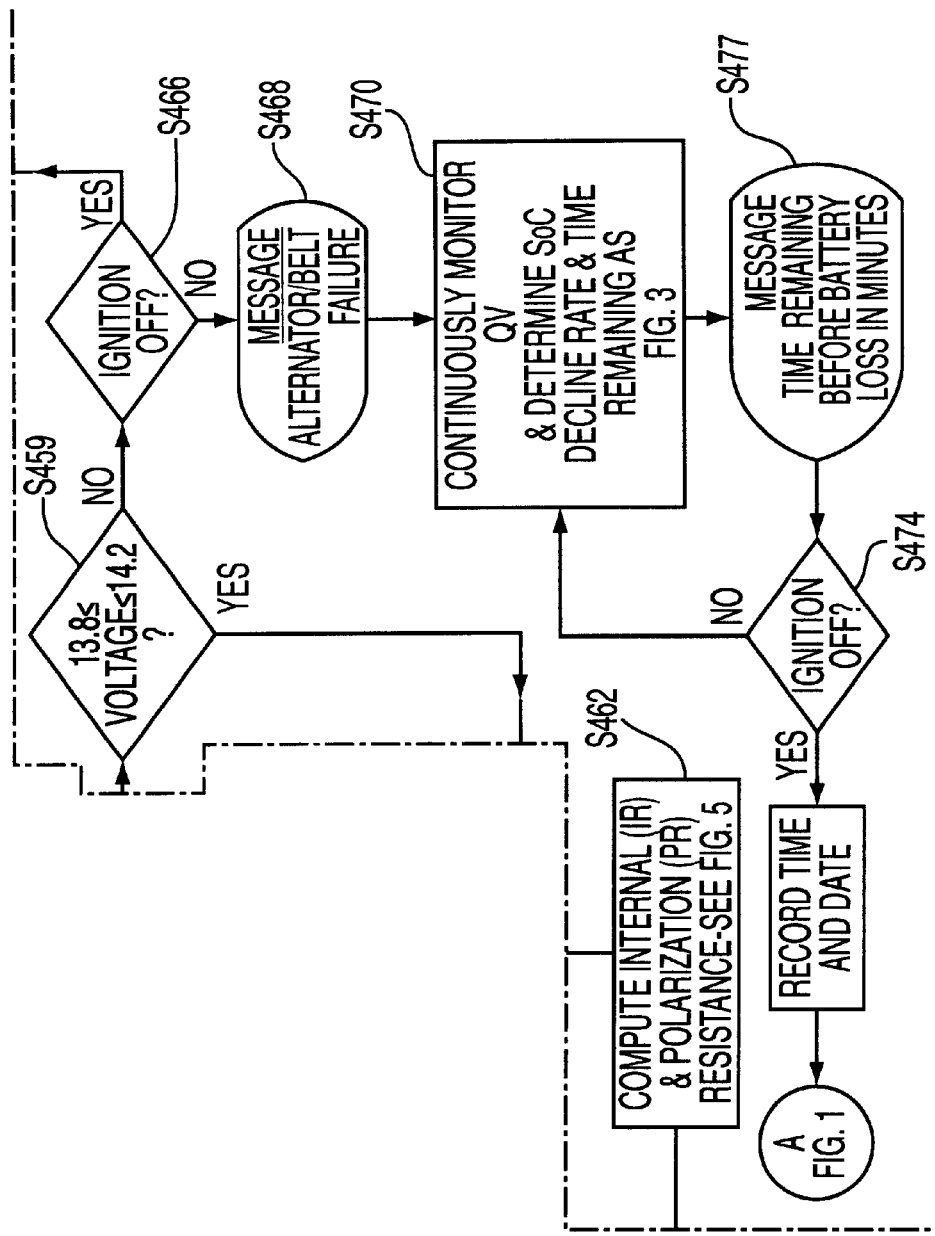
Figure 5:
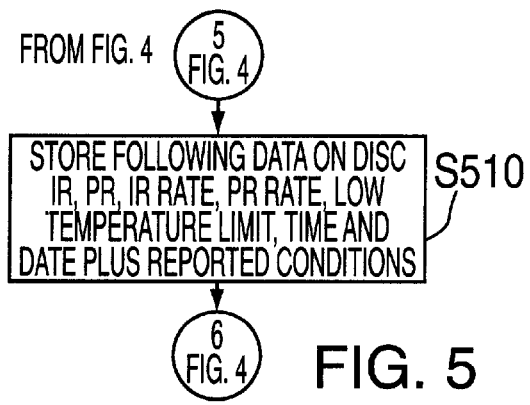

The program then proceeds to point 5 in both FIGS. 4 and 5. In FIG. 5, the following is stored in the database: IR, PR, IR Rate, PR Rate, low starting temperature limit, time and date plus any previously reported conditions and messages for subsequent access through a diagnostic connector on the vehicle or used externally. Following data storage, execution proceeds to point 6 in both FIGS. 5 and point 8 in FIG. 4 and then back to S456. S456 re-initiates current and voltage monitoring and continuation of the S456, S448, S459 and S460 steps and back to S456 monitoring loop (FIGS. 4C, 4D).

The right-hand part in FIGS. 4A, 4B depicts three possible operating conditions. The first, and more usual, begins at entry point 3 (FIG. 4A). S440, as described below, continues if it is determined in S442 that the battery is accepting a charge through the normal and usual conditions following an engine start.

The second condition includes operations that follow from a NO response in S459 (FIG. 4D) and includes subsequent operations in S466 and S468 when the engine is purposely stopped by turning the engine "off" for a gasoline engine or stopping fueling for a diesel engine. Since the battery is always monitored, the program goes back to A in FIG. 1.

The third condition is relative to the possibility of a charging system failure that may have occurred prior to engine starting or subsequent to starting. S480 (FIG. 4B) determines if such failure occurred by determining if the alternator voltage acquired in S478 is greater than the recently acquired QV. This QV was acquired immediately before ignition On was sensed, as in S215 in FIG. 2 and the engine was in the "Sleep Mode". QV is only acquired and updated during those times when the engine is not being operated, i.e., in the "Sleep Mode".

The system is always active and concerned with monitoring performance, performing analyses and reporting conditions. As to the first condition referred to above, starting at S440 in FIG. 4A, there is an entry point 3 from FIG. 2, which is the data point when the engine is running at self-sustaining speed. In S442 a determination is made as to whether or not the battery is accepting charge. This is accomplished by measuring the current flow into and out of the battery. S441 sets a time during which a series of measurements and computations are made. In the embodiment herein described, this time to it is set to be 100 ms. Any suitable time value can be used.

If the battery is accepting charge, the program proceeds to S444 and makes a determination as to whether the voltage of the battery is greater than the last measured QV. If the determination is YES, then the time loop of S441 is terminated and other steps of the program proceed. If the determination in S446 is NO, then a measurement is made in S448 if the alternator voltage is between the values of 13.8 and 14.2V. The reason that this range is selected is because, as noted above, this range is the normal range for a 12 volt system and the voltage required by a vehicle, although the voltage can be lower with a current flow into the battery. The actual output voltage is controlled by a temperature sensing resistor in or associated with the voltage regulator. If the battery voltage is not within this range, then S446 is signaled to restart the 100 ms time loop of S441.

If in S448 it is determined that the battery voltage is within the 13.8–14.2 volt range, then in S450 the amount of the battery charge is incremented or decremented (totalized). It should be recalled that the battery charge quantity is available as measured in coulombs.

The monitoring of the battery for charge and the totalizing of the charge is continued in S452 for as long as it is determined in S454 that the battery is accepting charge (FIG. 4C). This data is provided by the current sensing device 110. If in S454 it is determined that the battery is not accepting charge, then S456 sets up a cyclic monitoring of battery voltage and current. That is, the battery voltage and current are monitored alternately for predetermined periods of time, here the time being one second. At this point there is the combination of data from the computer database of the quantities of IR, PR, IR Rate, PR Rate, low temperature limit, time and other reporting conditions. The development of these quantities and their storage in the computer database has been previously described.

From the data available in S456, a determination is made in S458 as to whether or not the battery is being discharged. If it is not, then the battery is being charged and the program proceeds to S460. If this is the first time entry into S460 after the engine has attained self-sustaining speed an internal flag signal, "First Time Since Start" is generated. At the exit from S261 in FIG. 2, the flag is reset and execution continues in S462 (FIG. 4D) where IR and PR are determined as previously described. If the "First Time Since Start" flag is in reset, execution returns to S456. Following PR and IR determination in S462 this data is supplied to S464 (FIG. 4C) where the IR is temperature corrected, the reason for this being that IR is influenced by ambient temperature.

The data for temperature correction is available in the computer database, as previously described. Also, as previously described, the low starting temperature limit has been determined. Execution continues to Point 9 and then to S402 (FIG. 4A) where battery analyses as previously described is implemented. Following battery analyses, execution continues to exit point 5 and then to entry point 5 in FIG. 5. The availability of this information immediately after starting is important to allow for correction. This information is stored at and is made available at a system, or vehicle or diagnostic connector.

Returning to S458 (FIG. 4C), if it is determined that the battery is being discharged then in S459 (FIG. 4D) battery voltage is measured to see if it is in the range between 13.6 and 14.2 Volts, this is the normal output voltage for a 12 volt system alternator. A YES response indicates the alternator is performing properly and possibly restoring the battery charge drained during starting. The program returns to S456 and S458 to repeat the check as to whether or not the battery is being discharged.

As to the second condition referred to above, in S459 when the response is NO, which signifies the alternator is not providing the proper output voltage, then in S466 (FIG. 4D) a check is made to see if the ignition switch is "off". If the ignition switch is "off", engine starting may have failed. Regardless, time and date are recorded in S468 and execution returns to the beginning at data entry point A in FIG. 1.

However, if in S466 if it is determined that the ignition switch is not "off", and the current from the alternation is substantially zero, this is an indication of a possible problem with the alternator or the alternator belt. S466 initiates a display on display 128 of a message to this effect which is shown in S468 as "Alternator/Belt Failure". Also, under the condition of a possible alternator or alternator belt failure, the program in S470 proceeds to continually monitor QV and determines the SoC Decline Rate (SoC DR of S331 and S313) and the time of life remaining on the battery as determined and displayed in S330–S336 in FIG. 3. In S472 a message is displayed of the "Time Remaining Before Battery Loss" in minutes or other time unit. Since the vehicle is probably being driven, S472 provides the operator with continuous advisories, including the time remaining before the battery can no longer support engine start and critical vehicle functions.

Following the message issued in S472, a check is made in S474 as to the ignition switch state. If it is in the "off" state, then a time and date record is made in memory in S476 of the message issued in S472 and execution continues to data entry point A in FIG. 1. If the ignition is "on", then S470 is repeated to update the battery life time remaining for the message display of S472.

Returning to S440 in FIG. 4A, if it is determined in S442 that the battery is not accepting charge, a time delay is initiated in S475 (FIG. 4B), this illustratively being 0.1 seconds. This delay and the 10 second loop time controlled by S477 are intended to allow an alternator to reach the maximum output required to restore battery charge after starting. When S442 indicates the battery is accepting charge and S444 determines battery voltage is greater than the last QV, the alternator is performing properly and the battery appears to be recovering. Execution continues to S448. When the 10 second loop time expires in S476 and the S442 indicates the battery is not accepting charge, charging system failure is indicated and the program proceeds to S478. In S478 the battery voltage is measured and in S480 it is determined if this voltage is equal to or greater than the last measured QV. QV is never updated after a start. The only time QV is updated is during those times when an engine and vehicle are not being operated. The QV cited as the last QV is the QV value acquired and stored immediately before an "Ignition On".

Referring to the third condition, if S480 response is YES, then more than one charging system abnormal condition may exist since battery voltage is higher than the last measured QV. Then in S482, battery discharge is monitored and summed and battery charge is reduced in coulombs, by sending a signal to control the alternator regulator. Also, a message is displayed in S484 that the "Battery is Not Charging" and the SoC in percent. Following S484, a check is made in S486 as to the status of the ignition switch. If it is "off", then the indication of the message display is made of record and is available at data entry point 2 in FIG. 2. If the determination is that the switch is "on", then in S488 a message is caused to be displayed that the "Ignition is On" and the program returns to S482. This provides an update of the battery SoC as displayed in S484.

Returning to S480, in the presence of the conditions of the battery not accepting charge for a period of time more than 10 seconds and the battery voltage not being greater than the last measured QV, then S490 monitors and sums the battery charge/discharge (in coulombs). This causes the display of a message in S492 of the "Battery Not Charging—Check Alternator and Belt" and also in S494 of a message to instruct the operator to "Turn Ignition Off". It also triggers the display of the message of S484 relative to the battery not charging and an indication of the current batter SoC.

While the invention has been particularly shown and described with reference to preferred embodiments thereof, it will be understood by those skilled in the art that various changes in form and details may be made therein without departing from the spirit and scope of the invention.

We claim:

1. A system for monitoring the condition of a battery installed in a vehicle having an engine, said system comprising:
   a voltage sensor for determining the voltage of the battery at the time of starting of the vehicle engine;
   a current sensor for determining the current drain of the battery at said time of starting of the engine; and
   computer means for computing the rate of change of the battery dynamic internal resistance (IR) and the rate of change of the battery dynamic polarization resistance (PR) based on determinations of voltage and current by said voltage sensor and said current sensor at different times of vehicle engine start, said computer means further including means responsive to an increasing dynamic IR and an increasing dynamic PR for producing an indication of low electrolyte in the battery.

2. A system for monitoring the condition of a battery installed in a vehicle having an engine, said system comprising:
   a voltage sensor for determining the voltage of the battery at the time of starting of the vehicle engine;
   a current sensor for determining the current drain of the battery at said time of starting of the engine; and
   computer means for computing the rate of change of the battery dynamic internal resistance (IR) and the rate of change of the battery dynamic polarization resistance (PR) based on determinations of voltage and current by said voltage sensor and said current sensor at different times of vehicle engine start, said computer means further including means responsive to said dynamic IR increasing and said dynamic PR decreasing for initiating an indication of at least one of possible battery terminal corrosion or loose connection of a cable connecting a terminal of the battery to the vehicle electrical system.

3. A system for monitoring the condition of a battery in a vehicle having an engine, said system comprising:
   a voltage sensor for determining the voltage of the battery at the time of starting of the vehicle engine;
   a current sensor for determining the current drain of the battery at said time of starting of the engine; and
   computer means for computing the rate of change of the battery dynamic internal resistance (IR) and the rate of change of the battery dynamic polarization resistance (PR) based on determinations of voltage and current by said voltage sensor and said current sensor at different times of engine start, said computer means further including means responsive to said dynamic IR decreasing and said dynamic PR increasing for initiating an indication of the battery being unable to start the engine below a certain ambient temperature.

4. The system as in claim 3 wherein said computer means includes storage means for storing data of the battery output as a function of its dynamic IR and temperature; and
   said computer means computing a low temperature limit at which the battery will be unable to start the engine on the basis of the dynamic IR and said stored data.

5. A system for monitoring and reporting on the condition of a battery installed in a vehicle having an engine and an ignition, said system comprising:
   a sensor for determining the voltage across the battery terminals under conditions of current drain of the vehicle electrical system to determine the quiescent voltage current drain value (QV); and
   means for calculating the battery state-of-charge (SOC) on the basis of the measured QV.

6. A system as in claim 5 further comprising:
   a voltage sensor for determining the voltage of the battery at the time of starting of the vehicle engine;
   a current sensor for determining the current drain of the battery at said time of starting of the engine; and
   wherein said calculating means includes mean for computing at least one of the battery dynamic internal resistance (IR) and the battery internal dynamic polarization resistance (PR) on the basis of said determined voltage and current.

7. A system as in claim 5 further comprising:
a vehicle charging system; and
a sensor for determining if the vehicle ignition is off; and
wherein said calculating means further includes means for producing an indication of at least one of a possible vehicle battery charging system component problem and battery state-of-charge condition in response to a determination that the ignition is off.

8. A system as in claim 7 wherein said means for producing also compares QV relative to predetermined voltage values and determines the type of indication based on the result of the comparison.

9. A system as in claim 5 further comprising:
an ignition sensor to determine if the vehicle ignition is off;
a current sensor to sense the current drain of the vehicle electrical system; and
wherein said calculating means further includes means for producing an indication of the occurrence of an excessive current drain.

10. A system as in claim 9 wherein said calculating means further includes battery condition determining means responsive to a measured current drain greater than a predetermined value for a predetermined time period having elapsed since the ignition being cut off and QV being less than a predetermined voltage to produce an indication of at least one of then battery losing charge and the battery not being able to start the engine.

11. A system as in claim 10 wherein said predetermined voltage has first and second levels and said battery condition determining means produces the indication of the battery being unable to start the engine when QV is less than said second level, which second level is less than said first level.

12. A system as in claim 5 wherein said calculating means also indicates at least one of a decline rate of the SoC over a period of time and a decline of QV over a period of time and determines the time remaining during which the battery is still able to start the vehicle engine based on at least one of the computer SoC decline rate and QV decline rate.

13. A system as in claim 12 wherein said calculating means further includes means to compare the time remaining against a predetermined time period and to produce an indication when said predetermined time period has been exceeded.

14. A system for monitoring and reporting on the condition of a battery installed in a vehicle having an engine and an ignition, said system comprising:
a voltage sensor four determining the voltage across the battery terminals under conditions of current drain of the vehicle electrical system up to a predetermined current drain value (QV);
an ignition sensor to determine if the vehicle ignition is on;
a starter sensor to determine if the engine starter is on;
an engine sensor to determine if the engine is running a self sustaining speed; and
means for calculating the battery state of charge (SoC) on the basis of the measured QV, said calculating means including engine start up condition determining means for producing an indication that there is an engine start failure and the battery is losing charge in response to a determination of the ignition being on, a determination of the starter being off for more that a predetermined time, and a determination of the engine not being at a self-sustaining speed.

15. A system for monitoring and reporting on the condition of a battery installed in a vehicle having an engine, said system comprising:
a sensor for determining the voltage across the battery terminals under conditions of current drain of the vehicle during electrical system start up to determine quiescent voltage drain value (QV);
and means for calculating the battery state-of-charge (SoC) on the basis of the measured QV, said calculating means also indicating at least one of a decline rate of the SoC over a period of time and a decline rate of QV over a period of time and determining the time remaining during which the battery is still able to start the vehicle engine based on at least one of the computed SoC decline rate and QV decline rate, the time remaining based on the SoC decline rate being determined as $$\text{Time Remaining} = \frac{(\text{SoC} - 70)}{\text{SoC decline rate}}.$$

16. A system for monitoring and reporting on the condition of a battery installed in a vehicle having an engine, said system comprising:
a sensor for determining the voltage across the battery terminals under conditions of current drain of the vehicle electrical system up to a predetermined quiescent voltage current drain value (QV); and
means for calculating the battery state-of-charge (SoC) on the basis of the measured QV, said calculating means also indicating at least one of a decline rate of the SoC over a period of time and a decline rate of the QV over a period of time and determining the time remaining during which the battery is still able to start the vehicle engine based on at least one of the computed SoC decline rate and QV decline rate, the time remaining based on the QV decline rate being $$\text{Time Remaining} = \frac{QV - 12.30}{QV \text{ decline rate}}.$$

17. A method for monitoring the condition of a battery installed in a vehicle having an engine, said method comprising:
determining the voltage of the battery at the time of starting of the vehicle engine;
determining the current drain of the battery at said time of starting of the vehicle engine;
computing the battery dynamic internal resistance (IR) and battery dynamic polarization resistance (PR) on the basis of the voltage and current determined by voltage and current sensors;
computing the rate of change of dynamic IR and dynamic PR based on determinations of voltage and current at different times of vehicle engine start; and
producing an indication of a specific battery condition in response to said dynamic IR increasing or decreasing while said dynamic PR is increasing or decreasing.

18. A method as in claim 17 wherein said step of producing an indication of a specific battery condition comprises producing an indication of low electrolyte in a battery in response to increasing dynamic IR and increasing dynamic PR.

19. A method as in claim 17 wherein said step of producing an indication of a specific battery condition comprises initiating an indication of at least one of possible battery terminal corrosion or loose connection of a cable connecting a terminal of the battery to the vehicle electrical system in response to dynamic IR increasing and dynamic PR decreasing.

20. A method as in claim 17 wherein said step of producing an indication of a specific battery condition comprises initiating an indication of the battery being unable to start the engine below a certain ambient temperature in response to dynamic IR decreasing and dynamic IR increasing.

21. A method as in claim 20 further comprising:
storing data of the battery output as a function of its dynamic IR and temperature; and
computing a low temperature limit at which the battery will be unable to start the engine based on the current IR and the stored data.

22. A method for monitoring and reporting on the condition of a battery installed in a vehicle having a engine and an ignition comprising:
determining the voltage across the battery terminals under conditions of current drain of the vehicle electrical system to determine the current quiescent voltage drain value (QV); and
calculating the battery state-of-charge (SoC) on the basis of the measured QV.

23. A method as in claim 22 further comprising:
determining the voltage of the battery at the time of starting the vehicle engine;
determining the drain of the battery at said time of starting of the engine; and
computing at least one of the battery dynamic internal resistance (IR) and dynamic polarization resistance (PR) on the basis of said determined voltage and current drain.

24. A method as in claim 22 further comprising:
sensing if the vehicle ignition is off; and
producing an indication of at least one of a possible vehicle battery charging system component problem and battery state-of-charge condition in response to a determination that the ignition is off.

25. A method as in claim 24 further comprising:
comparing QV relative to predetermined voltage values and selecting the type of indication based on the result of the comparison.

26. A method as in claim 22 further comprising:
sensing if the vehicle ignition is off;
sensing the current drain of the vehicle electrical system; and
producing an indication of the occurrence of an excessive current drain.

27. A method as in claim 22 further comprising:
sensing if the vehicle ignition is off;
sensing the current drain of the vehicle electrical system; and
determining, responsive to a measured current drain greater than a predetermined value for a predetermined time period having elapsed since the ignition was sensed being off and QV being less than a predetermined voltage, to produce an indication of at least one of the battery losing charge and the battery not being able to start the engine.

28. A method as in claim 22 further comprising:
sensing if the vehicle ignition is on;
sensing if the engine starter is on;
sensing if the engine is running at a self-sustaining speed; and
producing an indication that there is an engine start failure and the battery is losing charge in response to a determination of the ignition being on, a determination of the starter being off for more than a predetermined time and a determination of the engine not being at a self-sustaining speed.

29. A method as in claim 22 further comprising:
calculating at least one of a decline rate of the SoC over a period of time and a decline rate of QV over a period of time; and
determining the time remaining during which the battery is still able to start the vehicle engine based on at least one of the computed SoC decline rate and the QV decline rate.

30. A method as in claim 29 further comprising:
comparing the time remaining against a predetermined time period and producing an indication when said predetermined time period has been exceeded.

31. A method as in claim 22 further comprising:
accumulating the total value of the quantity of discharge from the battery over a period of time.

32. A method as in claim 31 further comprising:
producing an indication of the battery not charging in response to accumulating the value of the quantity of discharge from the battery.

* * * * *